USO09389248B2

(12) United States Patent
 Sasaki et al.

(10) Patent No.: US 9,389,248 B2
(45) Date of Patent: Jul. 12, 2016

(54) SAGNAC INTERFEROMETER-TYPE FIBER-OPTIC CURRENT SENSOR

(71) Applicant: Kabushiki Kaisha Toshiba, Minato-ku (JP)

(72) Inventors: Kinichi Sasaki, Tokyo (JP); Masao Takahashi, Kanagawa-ken (JP); Yukihisa Hirata, Tokyo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/454,782

(22) Filed: Aug. 8, 2014

(65) Prior Publication Data

US 2014/0347671 A1    Nov. 27, 2014

Related U.S. Application Data

(62) Division of application No. 12/965,147, filed on Dec. 10, 2010, now Pat. No. 8,836,950.

(30) Foreign Application Priority Data

Dec. 10, 2009 (JP) ................................. 2009-281021

(51) Int. Cl.
 *G01B 9/02* (2006.01)
 *G01R 15/24* (2006.01)
 (Continued)

(52) U.S. Cl.
 CPC .......... *G01R 15/246* (2013.01); *G01D 5/35322* (2013.01); *G01R 19/0092* (2013.01)

(58) Field of Classification Search
 CPC ... G01D 5/266; G01D 5/268; G01D 5/35303; G01D 5/35306; G01D 5/35322; G01R 15/246; G01R 19/0092
 See application file for complete search history.

(56) References Cited

U.S. PATENT DOCUMENTS 4,637,722 A * 1/1987 Kim ..................... G01C 19/726
                                                    356/464
4,765,739 A    8/1988 Koizumi et al.
(Continued)

FOREIGN PATENT DOCUMENTS

JP    59-195220 A    11/1984
JP    62-108110      5/1987
(Continued)

OTHER PUBLICATIONS

Extended Search Report issued Apr. 14, 2011 in European Patent Application No. 10194502.0-2213.
(Continued)

*Primary Examiner* — Michael A Lyons
(74) *Attorney, Agent, or Firm* — Oblon, McClelland, Maier & Neustadt, L.L.P.

(57) ABSTRACT

In one embodiment, a Sagnac interferometer-type fiber-optic sensor includes a synchronous detection circuit to carry out synchronous detection of detected light signal with a phase modulation angular frequency of a phase modulator. A signal processing circuit calculates and outputs the magnitude of current to be measured using the signal detected in the synchronous detection circuit. A phase modulator driving circuit controls the driving of the phase modulator. The phase modulator driving circuit controls a phase modulation depth of the phase modulator so that the amplitude of the second-order harmonics and the fourth-order harmonics obtained by carrying out the synchronous detection of the detected light signal with the phase modulation angular frequency becomes the same.

9 Claims, 18 Drawing Sheets

(51) Int. Cl.
*G01D 5/353* (2006.01)
*G01R 19/00* (2006.01)

(56) References Cited

U.S. PATENT DOCUMENTS

| | | | |
|---|---|---|---|
| 5,148,236 A * | 9/1992 | Blake | G01C 19/721 356/460 |
| 5,283,625 A | 2/1994 | Bunn, Jr. | |
| 5,644,397 A | 7/1997 | Blake | |
| 5,696,858 A | 12/1997 | Blake | |
| 5,987,195 A | 11/1999 | Blake | |
| 6,028,668 A | 2/2000 | Rider | |
| 6,429,939 B1 | 8/2002 | Bennett et al. | |
| 6,831,749 B2 | 12/2004 | Ohno et al. | |
| 6,891,622 B2 | 5/2005 | Dyott | |
| 7,038,786 B2 | 5/2006 | Blake | |
| 7,102,757 B2 | 9/2006 | Spahlinger et al. | |
| 8,836,950 B2 * | 9/2014 | Sasaki | G01R 19/0092 356/483 |
| 2002/0025098 A1 | 2/2002 | Dyott | |
| 2004/0095581 A1 | 5/2004 | Spahlinger et al. | |

FOREIGN PATENT DOCUMENTS

| | | |
|---|---|---|
| JP | 6-3155 A | 1/1994 |
| JP | 6-129863 A | 5/1994 |
| JP | 2000-515979 | 11/2000 |
| RU | 2008144790 A | 5/2010 |

OTHER PUBLICATIONS

Office Action issued Feb. 18, 2014 in Japanese Patent Application No. 2009-281021 (w/English translation only).
K. Sasaki, et al., "Development of DC Optical Current Transformer for Cable Protective Relay in Hokkaido-Honshu HVDC Link", The International Conference on Electrical Engineering 2009, pp. 1-6.
Frosio, Guido et al., Reciprocal reflection interferometer for a fiber-optice Faraday current sensor, Applied Optics, vol. 33, No. 25, (Sep. 1, 1994), pp. 6111-6122.
Li, Hua et al., A Novel Realization of Signal Processing to Improve the Precision of the Open-loop IFOG, Proceedings of SPIE, vol. 5634, (2005), pp. 323-329.
Bohm et al., (Bohm, Konrad et al., Performance of Lyot Depolarizers with Birefringent Single-Mode Fibers, Journal of Lightwave Tech., vol. LT-1, No. 1 (Mar. 1983), pp. 71-74).
Blake, J. et al., In-line Sagnac Interferometer Current Sensor, IEEE Transactions on Power Delivery, vol. 11, No. 1 (1996), pp. 116-121.
Mochizuki, Kiyofumi, Degree of polarization in jointed fibers: the Lyot depolarizer, Applied Optics, vol. 23, No. 19 (Oct. 1, 1984), pp. 3284-3288.
Blake, J. et al., In-line Sagnac Interferometer for Magnetic Field Sensing, Proceedings of SPIE, 10$^{th}$ Optical Fibre Sensors Conference (1994), pp. 419-422.
Bohnert, K. et al., Field Test of Interferometric Optical Fiber High-Voltage and Current Sensors, Proceedings of SPIE, 10$^{th}$ Optical Fibre Sensors Conference (1994), pp. 16-19.
Office Action issued May 28, 2015 in Japanese Patent Application No. 2009-281021 (with English language translation).
Office Action issued Nov. 10, 2015 in Japanese Patent Application No. 2009-281021 (with English language translation).

* cited by examiner

SAGNAC INTERFEROMETER-TYPE FIBER-OPTIC CURRENT SENSOR

CROSS-REFERENCE TO RELATED APPLICATION

This application is a division of and claims the benefit of priority under 35 U.S.C. §120 from U.S. Ser. No. 12/965,147 filed Dec. 10, 2010, and claims the benefit of priority under 35 U.S.C. §119 from Japanese Patent Application No. 2009-281021 filed Dec. 10, 2009, the entire contents of each of which are incorporated herein by reference.

FIELD

The present invention relates to a Sagnac interferometer-type fiber-optic current sensor using optical phase modulation.

BACKGROUND

Various types of Sagnac interferometer-type fiber-optic current sensors using optical phase modulation are proposed. For example, "All-fiber Sagnac current sensor" shown in FIG. 19 (refer to literature 1), the "Reciprocal reflection interferometer for a fiber-optic Faraday current sensor" shown in FIG. 20 (refer to literature 2), "Production method for a sensor head for optical current sensor" shown in FIG. 21 (refer to National Publication of translated version No. 2005-517961) and "Fiber optic current sensor" shown in FIG. 22 (refer to National Publication of translated version No. 2002-529709) etc. are proposed.

Moreover, "The optical fiber current sensor and its calibration equipment" shown in FIG. 23 (refer to Japanese Laid Open Patent Application No. 2005-345350), and "Fiber optics apparatus and method for accurate current sensing" shown in FIG. 24 (refer to National Publication of translated version No. 2000-515979), etc. propose methods for calculating an electrical current value from the detected light signal by a photodetector other than the conventional examples explained above.

According to the Sagnac interferometer-type fiber-optic current sensors shown in FIGS. 19 to 24, the optical phase modulation with a fixed amplitude and a fixed angular frequency is provided to the light by an optical phase modulator. As the optical phase modulator, a Pockels' cell phase modulator or a piezo-electric phase modulator configured by winding an optical fiber around a cylindrical piezo-electric tube element is used. In addition, the above-mentioned angular frequency is called as a phase modulation angular frequency, and the above-mentioned amplitude is called as a phase modulation depth.

[Literature 1] G. Frosio, H. Hug, R. Dandliker, "All-fiber Sagnac current sensor", in Opto 92 (ESI Publications, Paris), p 560-564 (April, 1992)

[Literature 2] G. Frosio and R. Dandliker, "Reciprocal reflection interferometer for a fiber-optic Faraday current sensor", Appl. Opt. 33, p 6111-6122 (September, 1994)

By the way, in the Sagnac interferometer-type fiber-optic current sensors shown in above FIGS. 19-24, the Pockels' cell type optical phase modulator or the piezo-electricity type phase modulator constituted by winding an optical fiber around the cylinder piezo-electricity element is used as the phase modulator. In either phase modulators, the light is phase-modulated by applying a voltage signal of the phase modulation angular frequency to the Pockels' cell element or the cylindrical piezo-electric tube element. Since the phase modulation depth at the time of the phase modulation is adjusted by the magnitude of the amplitude of the above-mentioned voltage signal, the phase modulation depth actually applied to the light is dealt with as proportional to the amplitude of the voltage signal applied to the phase modulator.

However, the phase modulator has temperature characteristics, and the phase modulation efficiency also changes according to the phase modulator's surrounding environmental temperature. Therefore, even if the amplitude of the voltage signal applied to the phase modulator is controlled at a set value, the phase modulation depth actually applied to the light varies. Moreover, the change of the phase modulation efficiency by such phase modulators is also caused by the degradation of the phase modulator itself besides the temperature change.

As a result, since even if the phase modulator is driven with a fixed phase modulation depth, the phase modulation actually applied changes. Accordingly, the change of the modulation depth results in a variation of the sensing output of the current sensor. In both phase modulators of the Pockels' cell phase modulator and the piezo-electric tube phase modulator as mentioned above, the light is phase-modulated by applying a voltage signal of the phase modulation angular frequency to the Pockels' cell element or the cylindrical piezo-electric tube element. Therefore, when a noise is overlapped on the voltage applied to the phase modulator, the sensing output of the Sagnac interferometer-type fiber-optic current sensor is also changed similarly.

In such conventional modulation method, even if the magnitude of the phase modulation actually applied to the light changes, the modulation system is not equipped with a feedback system at all by which the feedback operation is adjusted by detecting the change of the magnitude.

Furthermore, if a polarization extinction ratio in a propagation path of light, especially between a phase modulator and a quarter-wave plate changes, it causes a problem that the sensing output of the Sagnac interferometer-type fiber-optic current sensor changes, and the measurement accuracy is also reduced. For example, in the Sagnac interferometer-type fiber-optic current sensor shown in FIGS. 19 to 24, if the extinction ratio between the phase modulator and the quarter-wave plate deteriorates, the sensing output of the Sagnac interferometer-type fiber-optic current sensor changes. Accordingly, the measurement accuracy reduces.

Moreover, in the Sagnac interferometer-type fiber-optic current sensor proposed in FIG. 19 and FIG. 20, it is assumed that the phase modulator is optically connected with the quarter-wave plate by a polarization maintaining fiber. When mechanical stress, (the stress caused by vibration, sound, or a temperature change is included), is applied to the polarization maintaining fiber, a crosstalk occurs between the lights which propagate along two optic axes of the polarization maintaining fiber, and the polarization extinction ratio changes. Therefore, the sensing output of the Sagnac interferometer-type fiber-optic current sensor also changes.

There are various factors by which the mechanical stress is applied to the above polarization maintaining fiber. For example, people trample the polarization maintaining fiber, and stress may be applied to the fiber. Furthermore, when pulling out the polarization maintaining fiber from a case which causes the quarter-wave plate and a sensing fiber, the pulled out portion of the polarization maintaining fiber from the case is sealed by solder or bonding agent etc. in order to improve the sealing characteristics of the case. When the temperature change occurs at the sealed portion, stress is applied to the polarization maintaining fiber due to the difference in the coefficient of thermal expansion of the materials.

Furthermore, when accommodating the polarization maintaining fiber to optically connect between the phase modulator and the quarter-wave plate by winding in the shape of a coil, or when accommodating the polarization maintaining fiber in a protective tube, the stress is applied to the polarization maintaining fiber due to vibration or acoustic resonance. In this case, the polarization extinction ratio may change, and the sensing output of the Sagnac interferometer-type fiber-optic current sensor may also change.

Moreover, when the phase modulator is optically connected with the quarter-wave plate by the polarization maintaining fiber using an optical connector, the optical connector serves as mechanical connection. Accordingly, optic axis shift between the optically connected polarization maintaining fibers results in a crosstalk and a decrease in the polarization extinction ratio. Even if the polarization maintaining fibers are ideally connected by the optical connector, since the optical connector serves as mechanical connector as above-mentioned, the vibration and temperature change are applied to the optical connector. Accordingly, the optical axis shift may occur between the polarization maintaining fibers to be optically connected. Therefore, it is difficult to keep the polarization extinction ratio stable between the phase modulator and the quarter-wave plate.

Furthermore, when the polarization maintaining fiber between the phase modulator and the quarter-wave plate is optically connected by a fusion splice method using electric discharge, a slight optical axis shift may occur between the polarization maintaining fibers similarly. Therefore, when the polarization maintaining fiber (light transmitting fiber) to connect the sensor head having the quarter-wave plate with a signal processing unit having the phase modulator is separated once at a center portion in the Sagnac interferometer-type fiber-optic current sensor, and the polarization maintaining fibers are optically connected again, the polarization extinction ratio may change. Therefore, the sensed output of the optical current sensor may change, that is, sensitivity changes between before and after the separation of the above-mentioned polarization maintaining fiber.

Thus, the deterioration of the polarization extinction ratio may take place in any portions of the polarizer, the phase modulator and the polarization maintaining fiber to optically connect the optical components, and results in change of the sensing output of the optical current sensor.

Furthermore, when the signal processing methods proposed in FIG. 19, FIG. 21, FIG. 23, and FIG. 24 are used, and the polarization extinction ratio between the phase modulator and the quarter-wave plate changes, the sensed output of the Sagnac interferometer-type fiber-optic current sensor changes. Therefore, the linearity of the input-and-output characteristic deteriorates, and the measurement accuracy also falls due to the change of the sensed output of the current sensor.

In addition, according to the signal processing method shown in FIG. 24, a system is adopted in which one optical phase difference of the two phase modulators is offset by the other phase modulator, and a current value is calculated from the offset phase amount (practically, magnitude of the voltage signal specifically applied to the phase modulator). The detection system is generally called a Serrodyne detection system. In this case, more than two phase modulators are required, and unless the phase modulation efficiency of two phase modulators is not the same, it is difficult to measure correctly the offset phase amount from the voltage applied to the phase modulator. Therefore, the conventional method results in problems that the measurement accuracy falls, the cost is raised due to the use of two or more phase modulators, and the reliability of the sensor falls due to the increase in the number of parts used.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1A:
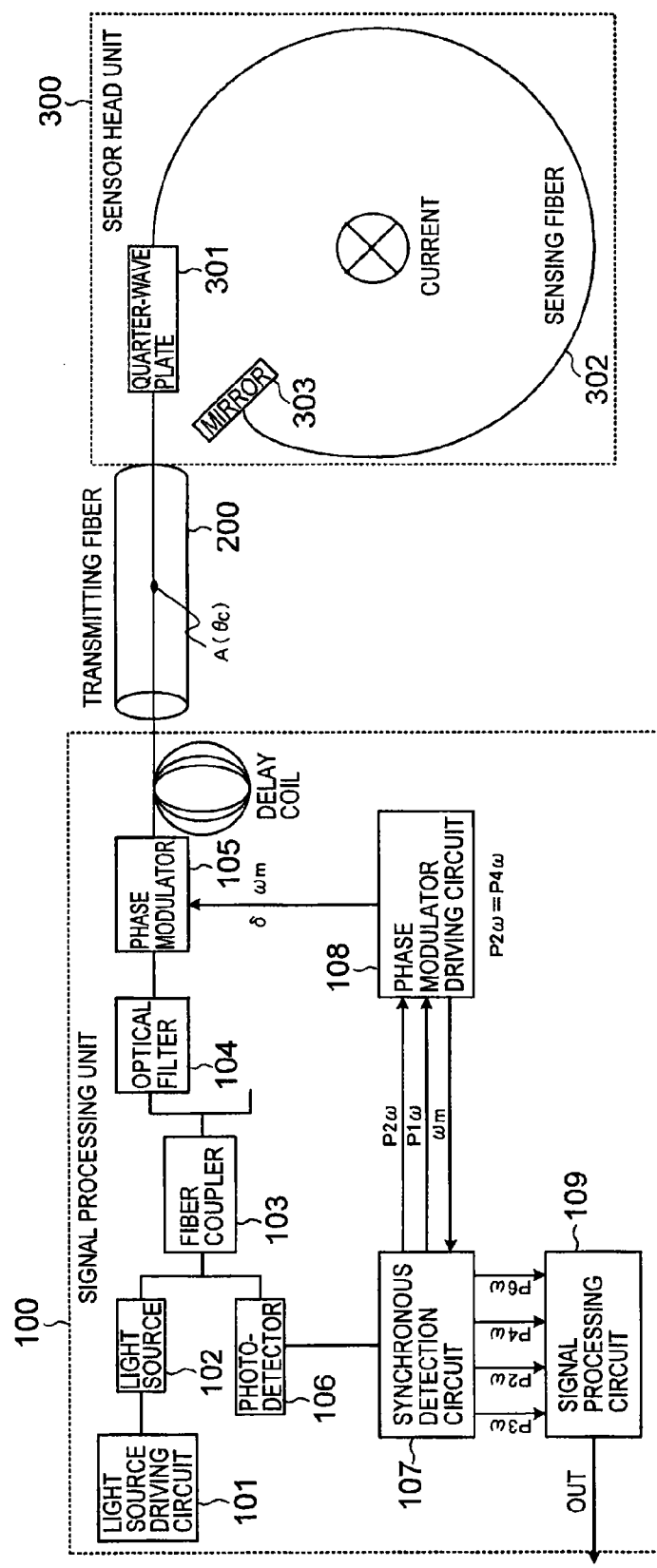
FIGS. 1A and 1H are figures showing a whole structure of Sagnac interferometer-type fiber-optic current sensor according to a first embodiment of the present invention.
Figure 1B:
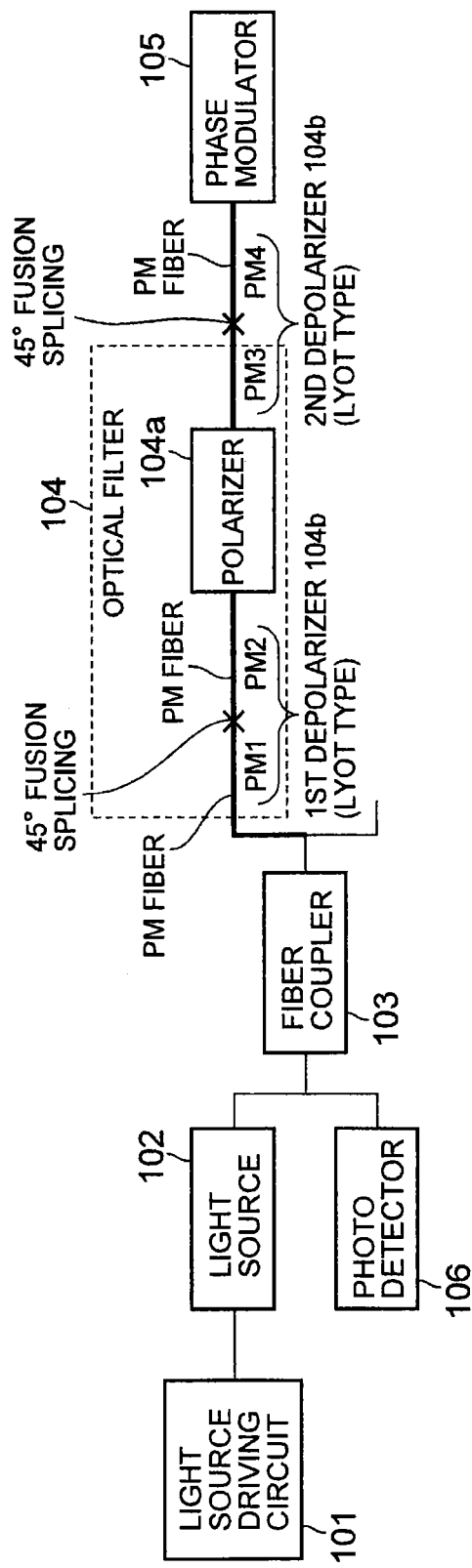
Figure 1C:
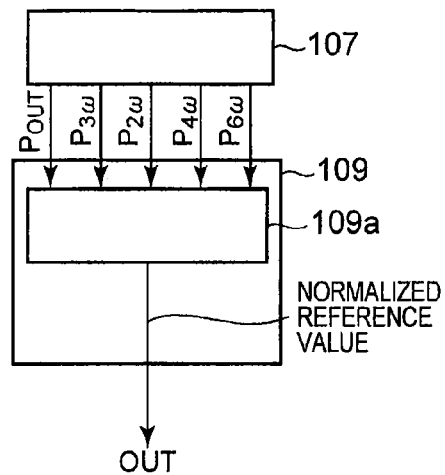
Figure 1D:
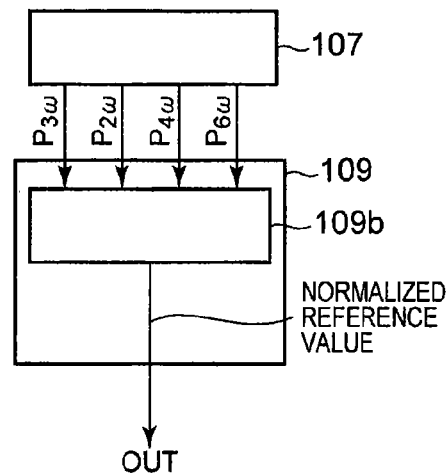
Figure 1E:
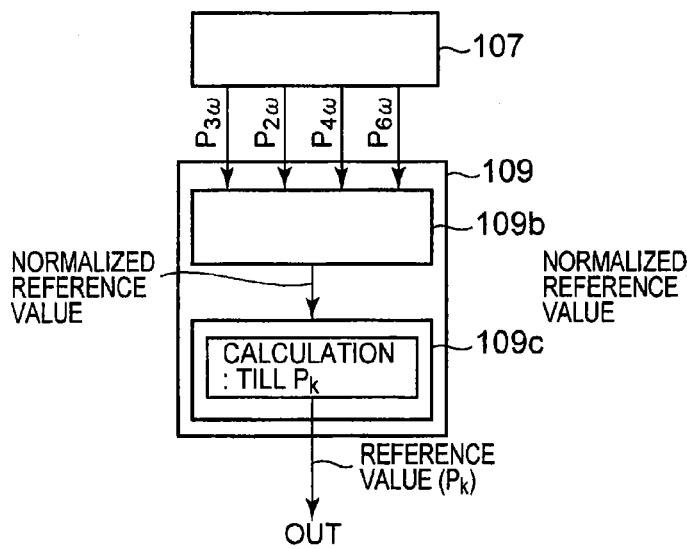
Figure 1F:
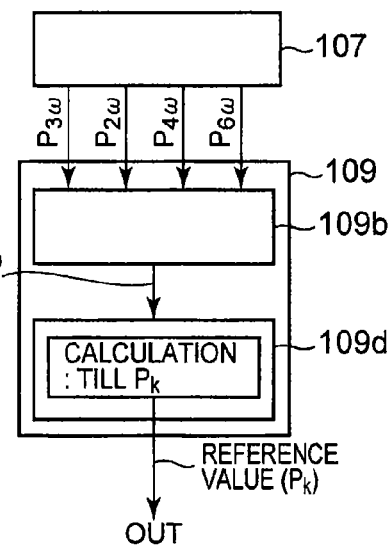
Figure 1G:
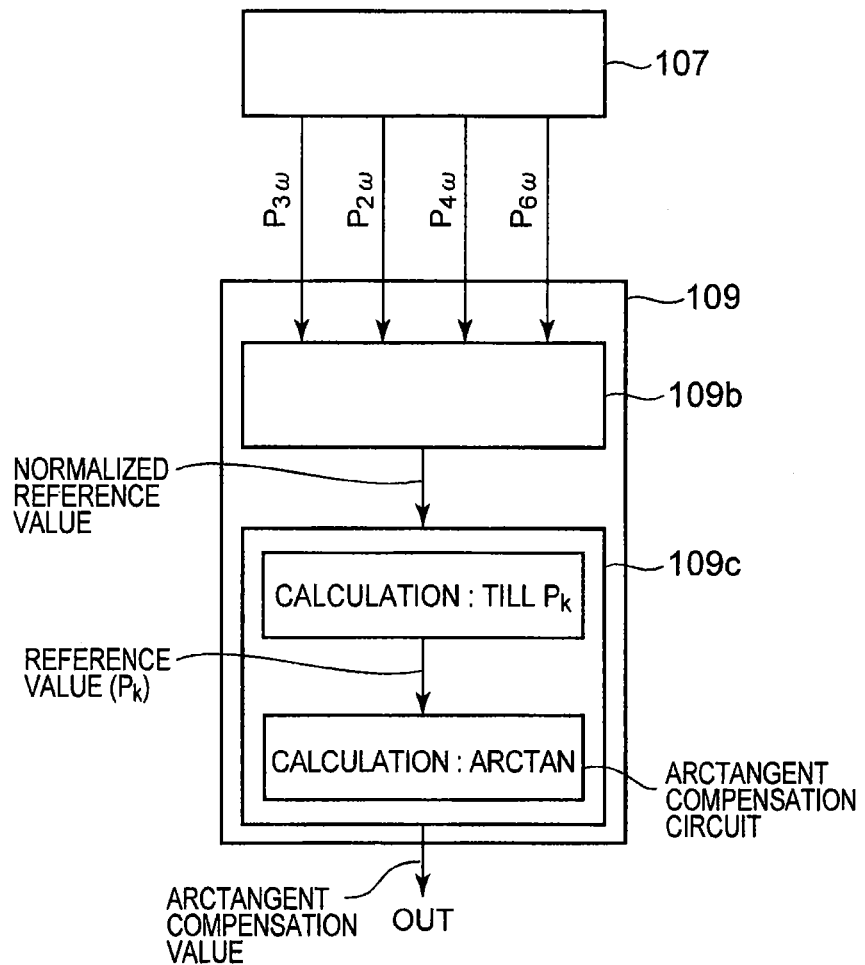
Figure 1H:
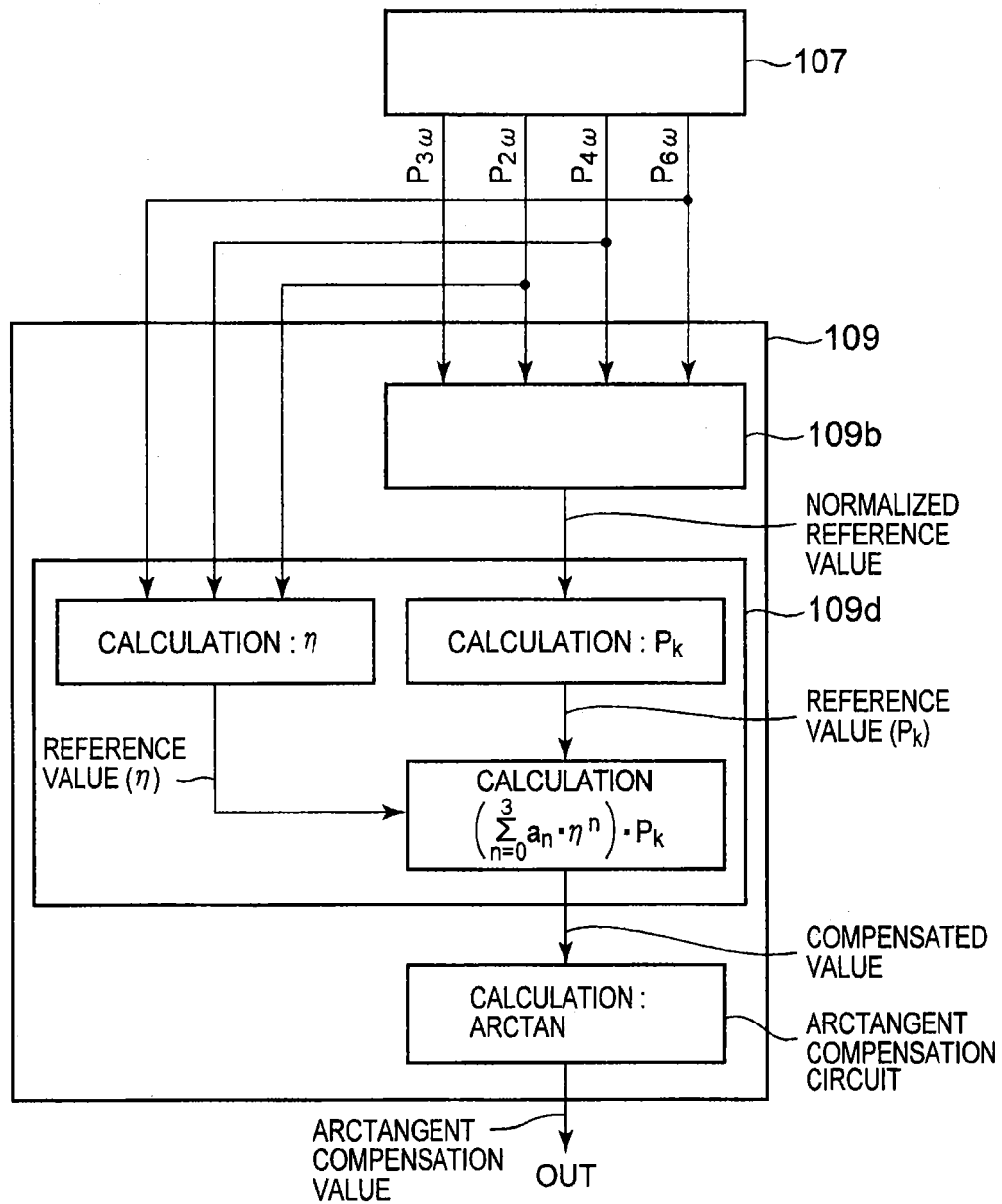

A Sagnac interferometer-type fiber-optic current sensor according to an exemplary embodiment of the present invention will now be described with reference to the accompanying drawings wherein the same or like reference numerals designate the same or corresponding parts throughout the several views.

According to one embodiment, a Sagnac interferometer-type fiber-optic sensor includes: a synchronous detection circuit to carry out synchronous detection of detected light signal with a phase modulation angular frequency of a phase modulator; a signal processing circuit to calculate and output the magnitude of current to be measured using the signal detected in the synchronous detection circuit; and a phase modulator driving circuit to control the driving of the phase modulator; wherein the phase modulator driving circuit controls a phase modulation depth of the phase modulator so that the amplitude of the second-order harmonics and the fourth-order harmonics of the detected signal obtained by carrying out the synchronous detection of the detected light signal with the phase modulation angular frequency becomes the same.

According to other embodiment, a Sagnac interferometer-type fiber-optic sensor includes: a synchronous detection circuit to carry out synchronous detection of the detected light signal with a phase modulation angular frequency of a phase modulator; a signal processing circuit to calculates and output the magnitude of current to be measured using the signal detected in the synchronous detection circuit; and a phase modulator driving circuit to control the driving of the phase modulator; wherein the phase modulator driving circuit controls a phase modulation depth so that the amplitude of the first-order harmonics obtained by carrying out the synchronous detection of the detected light signal with the phase modulation angular frequency becomes "0".

According to other embodiment, a Sagnac interferometer-type fiber-optic sensor includes: a synchronous detection circuit to carry out synchronous detection of detected light signal with a phase modulation angular frequency of a phase modulator; a signal processing circuit to calculate and output the magnitude of current to be measured using the signal detected in the synchronous detection circuit; and a phase modulator driving circuit to control the driving of the phase modulator; wherein the signal processing circuit includes; a normalization circuit to calculate a reference value by dividing any one amplitude of the odd-order harmonics by any one amplitude of the even-order harmonics, where the harmonics are obtained by carrying out the synchronous detection of the detected light signal with the phase modulation angular frequency, and a compensation circuit to compensate the normalized reference value with a ratio between any two amplitudes of the second-, fourth-, and sixth-order harmonics, and wherein the compensated value by the compensating circuit is outputted as an output signal proportional to the magnitude of the current to be measured.

1. First Embodiment

Next, the Sagnac interferometer-type fiber-optic current sensor according to the first embodiment of the present invention is explained below with reference to FIGS. 1 to 12. Hereinafter, the basic structure of the optical current sensor according to the first embodiment and fundamental operation shall be explained, and the Jones matrix shall be used to explain the behavior of the light.

First, the basic structure of the Sagnac interferometer-type fiber-optic current sensor according to the first embodiment is explained with reference to FIG. 1. FIG. 1 is a figure showing the basic structure of the Sagnac interferometer-type fiber-optic current sensor (Sagnac interferometer-type optical CT).

As shown in FIG. 1, the Sagnac interferometer-type fiber-optic current sensor includes a signal processing unit 100 which is composed of a light source driving circuit 101 described later, a light source 102, a fiber coupler 103, an optical filter 104, a phase modulator 105, a delay coil, a photodetector 106, a synchronous detection circuit 107 and a signal processing circuit 109.

Moreover, the current sensor includes a sensor head unit 300 which is composed of a quarter-wave plate 301 optically connected with the signal processing unit 100 through a light transmitting fiber 200, a sensing fiber 302, and a mirror 303.

In the signal processing unit 100, the light source driving circuit 101 is a circuit to drive the light source 102. A small LED (light emitting diode), a SLD (Super Luminescent Diode), etc. with coherent characteristics are used for the light source 102, and the output of the light source is optically connected with the optical fiber. In this case, it is possible to use a single mode fiber or a polarization maintaining fiber as the optical fiber. The polarization maintaining fiber is used if it is required that the polarization maintaining characteristic is kept good.

In general, since the light which came out of the light source 102 can be considered to be random light, the electric field component is defined by the following equation 1.

$$E_{in} = \frac{1}{\sqrt{2}} \begin{pmatrix} 1 \\ e^{i(\omega t + \phi_r)} \end{pmatrix} \quad (1)$$

Here, the coefficient $1/\sqrt{2}$ is provided to normalize so that an absolute value $|E_{in}|$ of $E_{in}$ becomes "1". The phase $\phi_r(t)$ is a phase difference which changes regardless of the x component of the $E_{in}$, and the random light is expressed with $\phi_r(t)$.

The fiber coupler 103 is an optical branch circuit to branch the light which comes out of the light source 102. One branch of the fiber coupler 103 is optically connected with an optical filter 104 which forms the polarizer. The fiber coupler 103 may be formed of either a single mode fiber coupler or a polarization maintaining fiber coupler. Especially, if it is required to keep the polarization characteristics good, the polarization maintaining fiber coupler is used.

The optical filter 104 is configured by the light polarizer 104a. The polarization state of the actual light from the light source 102 may not be uniform, although the light is random light. Therefore, a depolarizer 104b is inserted between the fiber coupler 103 and the polarizer 104a. The optical filter 104 is composed of the depolarizer 104b and the polarizer 104a. According to such structure, the output from the polarizer 104a is stabilized.

Figure 2:
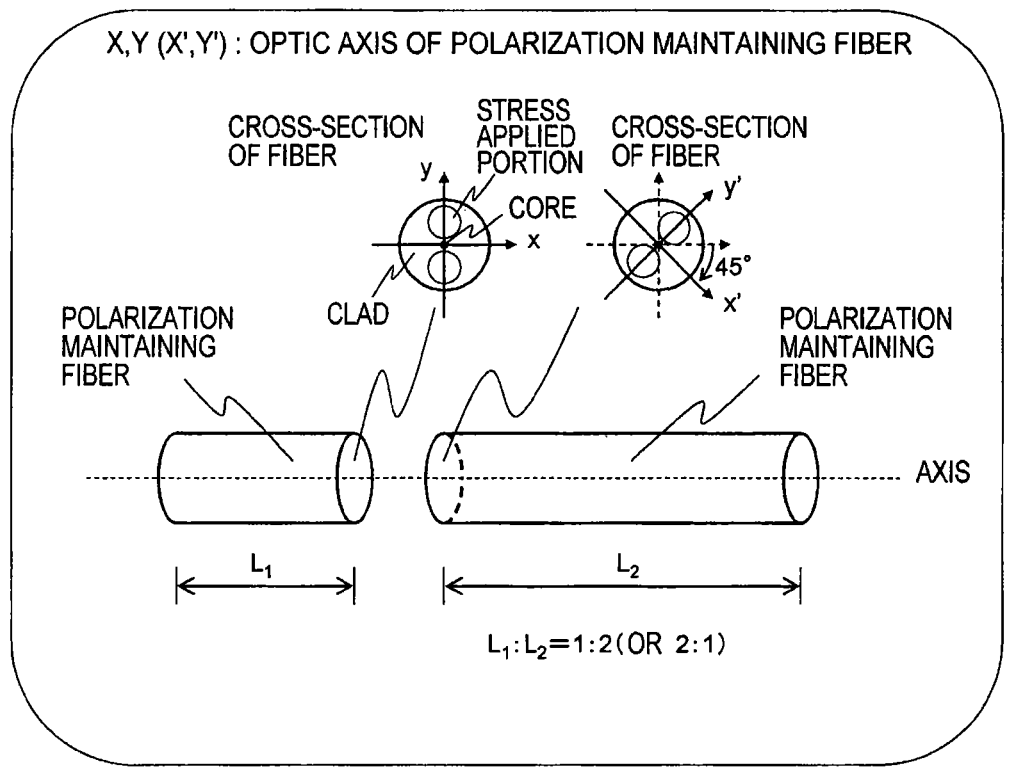
FIG. 2 is a figure showing a structure of a Lyot type depolarizer according to the first embodiment of the present invention.

In detail, it is supposed that the polarization maintaining fiber is used for the light polarizer 104a. Furthermore, a Lyot type depolarizer which is made by coupling the polarization maintaining fibers mutually with a rotation angle of approximately 45° between the optic axes of the respective polarization maintaining fibers is used as the depolarizer 104b as shown in FIG. 2. Here, the characteristic of the Lyot type depolarizer 104b is stabilized by setting the relation of the length of the respective polarization maintaining fibers connected mutually as 1:2 or 2:1 (refer to JOURNAL Of Light Wave Technology Vol. LT1 No. 1 Mar. 1983 P 71-P 74).

Moreover, when the polarization maintaining fiber coupler is used as the fiber coupler 103 which is an optical branch circuit, the depolarizer 104b is constituted by coupling the lead portion (polarization maintaining fiber) of the polarization maintaining fiber coupler with the polarization maintaining fiber (hereinafter expressed as a lead portion of the light polarizer) prepared for the purpose of propagating light by specifying the optic axis without affecting to a function of the polarizer 104a with a rotation angle of approximately 45° between the respective optic axis. According to this structure, since it is not necessary to insert the extra depolarizer, the number of coupling points to optically connect the fibers mutually also decreases. Furthermore, an optical coupling loss, an optical transmission loss, and a light propagation polarization characteristics are more stabilized, and which results in economical structure.

In addition, also when using such depolarizer 104b, a ratio of the length of the lead portion (polarization maintaining fiber) of the maintaining fiber coupler 103 to the length of the lead portion (polarization maintaining fiber) of the polarizer 104a is set to 1:2 or 2:1. Thereby, the stability of the depolarizer 104b is improved.

On the other hand, in the case where the polarizer 104a uses the polarization maintaining fiber, and the fiber coupler 103 uses a single mode fiber coupler, a polarization maintaining fiber is inserted between the lead portion (single mode fiber) of the single mode fiber coupler 103 and the polarizer 104a. The Lyot type depolarizer is constituted by coupling the polarization maintaining fiber and the lead portion (polarization maintaining fiber) of the polarizer 104a so that the respective optic axis of the polarization maintaining fibers rotate by 45°. According to this structure, since it is not necessary to insert an extra depolarizer specially, the number of coupling points to optically connect the fibers mutually also decreases. Furthermore, an optical connection loss, an optical transmission loss, and a light propagation polarization characteristics are more stabilized, and which results in economical structure.

In addition, the stability of the depolarizer 104b is raised by setting the ratio of the length of the polarization maintaining fiber optically connected to the single mode fiber coupler and the length of the lead portion (polarization maintaining fiber) of the polarizer 104a to 1:2 or 2:1.

Moreover, although the polarizer 104a can be considered to be an element which passes one of x and y components of the incident light, it is supposed that only x component of the incident light is passed, and the Jones matrix $L_p$ of the polarizer is defined as the following equation 2 for explanation.

$$L_p = \begin{pmatrix} 1 & 0 \\ 0 & 0 \end{pmatrix} \quad (2)$$

The polarizer 104a is constituted by a fiber type polarizer using the polarization maintaining fiber or a bulk element type fiber polarizer formed by combining a crystal element with the polarization maintaining fiber, etc. Here, the optic axes of the polarizer 104a are specified with the optic axis of the polarization maintaining fiber to constitute the polarizer 104a. That is, the polarizer 104a shall be an element which makes the light pass along one of the two optic axes of the polarization maintaining fiber constituting the polarizer 104a, and the polarizer 104a propagates only x component of the light.

A PZT type phase modulator constituted by winding the polarization maintaining fiber around a piezo-electric tube (PZT) or a Pockels' cell element, etc. are used as the phase modulator 105.

When using the Pockels' cell element type phase modulator as the phase modulator 105, the polarization maintaining fiber mentioned above is used for introducing the light to the Pockels' cell element and retrieving the light from the Pockels' cell element. In the phase modulator 105, a relative phase modulation is provided to the light which propagates one of two optic axes of the polarization maintaining fiber. That is, the direction of the phase modulation is defined by the optic axis of the polarization maintaining fiber which constitutes the phase modulator 105.

Moreover, as the light propagating along the respective two optic axes of the polarization maintaining fiber, the light propagating in the phase modulator 105 without being affected by the phase modulation is used. In addition, the phase modulator 105 is supposed to provide a relative phase modulation to only x component of the light for explanation.

Moreover, the optic axis of the polarization maintaining fiber which constitutes the phase modulator 105 is optically connected with the polarization maintaining fiber which constitutes the polarizer 104a mentioned above in which the respective axes are rotated by 45°. Changing into the state where the respective polarization maintaining fibers are rotated by 45° becomes equivalent to make independent linear polarization lights respectively pass along the two optic axes of the polarization maintaining fiber which constitutes the phase modulator 105. As a result, the Lyot type depolarizer is constituted by the lead portion (polarization maintaining fiber) of the polarizer 104a and the lead portion of the phase modulator 105 (polarization maintaining fiber).

Here, when the polarization maintaining fiber (lead portion of the phase modulator 105) optically connected to the polarizer 104a (optical filter 104) side and prepared for the purpose of specifying an optic axis and propagating the light to the phase modulator 105 without affecting the function of the phase modulator 105 is optically connected with the polarization maintaining fiber (lead portion of the polarizer 104a) optically connected to the phase modulator 105 side prepared for the purpose of specifying an optic axis and propagating the light to polarizer 104a without affecting the function of the polarizer 104a by rotating the respective axes by 45°, the ratio of the respective length of the polarization maintaining fibers is set to 1:2 or 2:1. Thereby, since it becomes possible to set the delay time lag between the x and y components of the light propagating in the phase modulator 105 longer than a possible interfering time (coherent time), the independency of the x and y components which propagate in the phase modulator 105 becomes higher. Accordingly, the optical characteristic is more stabilized.

In addition, when using the Lyot type depolarizer for the optical filter 104, the ratio of the full length of the Lyot type depolarizer used for the optical filter 104 and the depolarizer constituted between the polarizer 104a and the phase modulator 105 is set to 1:2n or 2n:1 (here, n is one or more integers). Since, interference by the polarization components which remain in each depolarizer is also controlled by this structure, an optical phase drift can be controlled as a result, and it becomes possible to control the zero point drift as the optical current sensor.

Moreover, as mentioned above, the linear polarized light penetrates the phase modulator 105 after passing the light polarizer 104a in the state where the optic axes of the polarizer 104a and the optic axis of the phase modulator 105 are shifted by 45°. Thus, the behavior of the light propagating in the phase modulator 105 by rotating the optical axes by 45° is expressed using the Jones matrix (equivalent to rotation by −45° with respect to incident direction angle) as the following equation 3.

$$L_{45°} = \begin{pmatrix} \cos 45° & -\sin 45° \\ \sin 45° & \cos 45° \end{pmatrix} \qquad (3)$$

$$= \frac{1}{\sqrt{2}} \begin{pmatrix} 1 & -1 \\ 1 & 1 \end{pmatrix}$$

In addition, the relative phase difference φ is provided to the x component of the light propagating in the phase modulator 105. Here, if the light receives a phase modulation at time $t=\tau_1$, the phase difference φ is expressed with the following equation 4.

$$\phi = \delta \sin \omega_m (t-\tau_1) \qquad (4)$$

where δ is a phase modulation depth and $\omega_m$ is a phase modulation angular frequency.

Therefore, the behavior of the light in the phase modulator 105 is expressed with the following equation (5) using the Jones matrix.

$$L_{PM} = \begin{pmatrix} e^{i\phi} & 0 \\ 0 & 1 \end{pmatrix} \qquad (5)$$

The two linearly polarized lights, which pass in the phase modulator 105 so as to be restrained by each of the two optic axes of the polarization maintaining fiber forming the lead portion of the phase modulator 105, are led to the light transmitting fiber 200 formed of the polarization maintaining fiber. Then the two linearly polarized lights which passed the light transmitting fiber 200 are introduced into the quarter-wave plate 301 of the sensor head unit 300.

The transmitting fiber 200 is optically connected with the quarter-wave plate 301 of the sensor head unit 300 to be mentioned later so that the respective optic axes rotate by 45° (equivalent to rotation of −45° with respect to an incident direction angle). If this relation is expressed with the Jones matrix, the matrix becomes the same as that of the above equation 3.

The sensor head unit 300 is constituted by the quarter-wave plate 301 to generate a phase difference of ¼ wave, a sensing fiber 302 formed in the shape of a loop to generate the Faraday phase difference, and the mirror 303 which reflects the light from the sensing fiber 302.

In the quarter-wave plate 301 of the sensor head unit 300, the phase difference of ¼ wave (360°/4=90°) for the x component of the passing light is generated. Consequently, the two linearly polarized lights passed in the transmitting fiber 200 are converted into two circular polarized lights of a clockwise propagated light and a counterclockwise propagated light in opposite directions. The behavior of the light in the quarter-wave plate 301 is expressed with the following Jones matrix (equation 6).

$$L_{QWP} = \begin{pmatrix} e^{i90°} & 0 \\ 0 & 1 \end{pmatrix} \qquad (6)$$

$$= \begin{pmatrix} i & 0 \\ 0 & 1 \end{pmatrix}$$

The sensing fiber 302 is arranged so as to surround the current to be measured and generates the phase difference (Faraday phase difference) which is equivalent to the rotation according to the Faraday effect as shown in FIG. 1. The Faraday phase difference $\theta_f$ generated according to the Faraday effect in the sensing fiber 302 is expressed with a following equation 7.

$$\theta_f = n \cdot V \cdot I \qquad (7)$$

where, n: the number of turns of the fiber which surrounds the current to be measured,
V: the Verdet constant of the sensing fiber,
I: the current value to be measured.

In the above example, the case where the sensing fiber 302 is arranged so as to surround the current is explained. However, the current coil may surround the sensing fiber 302 reversely. In this case, n becomes a number of turns of the current coil in which the current flows. The Faraday phase difference in the sensing fiber 302 is expressed with the Jones matrix as the following equation 8.

$$L_F = \begin{pmatrix} \cos\theta_f & -\sin\theta_f \\ \sin\theta_f & \cos\theta_f \end{pmatrix} \qquad (8)$$

The mirror 303 is provided in one end of the sensing fiber 302, and reverses the y component of the light by reflecting two circular polarized lights which passed in the sensing fiber 302 as shown in FIG. 1. The effect of the mirror 303 is expressed with Jones matrix as the following equation 9.

$$L_M = \begin{pmatrix} 1 & 0 \\ 0 & -1 \end{pmatrix} \qquad (9)$$

The two circular polarized lights reflected by the mirror 303 receive the Faraday effect in the sensing fiber 302 again. However, since the direction of the sensed magnetic field becomes opposite between the light propagating to the mirror 303 direction and the light propagating to the reflected direction by the mirror 303, the behavior of the light propagating in the inside of the sensing fiber 302 is expressed with the following equation 10 using the Jones matrix.

$$L_F = \begin{pmatrix} \cos\theta_f & \sin\theta_f \\ -\sin\theta_f & \cos\theta_f \end{pmatrix} \qquad (10)$$

The two circular polarized lights which passed in the sensing fiber 302 are introduced into the quarter-wave plate 301, and generates the phase difference of ¼ wave (360°/4=90°) only in the x component of the light again. Therefore, the behavior of the light in the quarter-wave plate is expressed with the above equation 6 using the Jones matrix.

Then, the two rotated circular polarized lights in the opposite directions by propagating in the sensing fiber 302 are respectively introduced into the light transmitting fiber 200

(polarization maintaining fiber) as two linearly polarized lights after passing in the quarter-wave plate 301. In addition, the quarter-wave plate 301 and light transmitting fiber 200 are optically connected in the state where the respective optic axes are arranged so as to rotate by 45° as the above (equivalent to rotation of −45° with respect to an incident direction angle). Accordingly, the effect is expressed with the above equation 3 using the Jones matrix.

Here, when the linearly polarized light, which propagates along the x axis of the two optic axes of the light transmitting fiber 200 and enters into the quarter-wave plate 301, re-enters into the light transmitting fiber 200 from the quarter-wave plate 301 via the sensing fiber 302, the light propagates along the y-axis of the two optic axes of the light transmitting fiber 200. Similarly, when the linearly polarized light, which propagates along the y-axis of the two optic axes of the light transmitting fiber 200 and enters into the quarter-wave plate 301, re-enters into the light transmitting fiber 200 from the quarter-wave plate 301 via the sensing fiber 302, the light propagates along the x axis of the two optic axes of the light transmitting fiber 200.

Then, while the light propagates in the light transmitting fiber 200 again and enters into the phase modulator 105, the phase modulator 105 provides a phase modulation with a relative phase difference φ' to the x component of the light which passes in the phase modulator 105. Supposing the light receives the phase modulation at time t=τ$_2$ here, the phase difference φ' is expressed with the following equation 11.

$$\phi' = \delta \sin \omega_m (t - \tau_2)$$

If the behavior of the light in the phase modulator 105 in this case is expressed with the Jones matrix, the behavior becomes as the equation 12.

$$L_{PM'} = \begin{pmatrix} e^{i\phi'} & 0 \\ 0 & 1 \end{pmatrix} \quad (12)$$

Further, the light which passed in the phase modulator 105 enters into the optical filter 104. Since the phase modulator 105 and light polarizer are optically connected so that the respective axes are rotated by 45° (equivalent to rotating by −45° with respect to the incident direction angle), the effect is expressed with the Jones matrix as the equation (3).

Therefore, the two linearly polarized lights which propagate in the phase modulator 105 are synthesized and interferes each other after passing the point where the phase modulator 105 and the light polarizer 105 are connected so that the respective optic axis of the phase modulator 105 and light polarizer 105 are rotated by 45°. In addition, since the light polarizer 105 propagates only x component of the incident light, the Jones matrix $L_p$ of the polarizer 105 is the same as that of the above equation 2.

Then, the light which passed in the optical filter 104 is split into two lights after passing the fiber coupler 103, and one branched light is detected with the photodetector 106. That is, one branched light of the two lights branched by the fiber coupler 103 is detected. Light/electric converters (O/E conversion element), such as a photo-diode and a photoelectron multiplier, are used as the photodetector 106. If the electric field component of the light which enters into the photodetector 106 is made into $E_{out}$ here, the relation between $E_{in}$ and $E_{out}$ is expressed with the following equation 13.

$$E_{out} = L_p \cdot L_{45°} \cdot L_{PM'} \cdot L_{45°} \cdot L_{QWP} \cdot L_{F'} \cdot L_M \cdot L_F \cdot \quad (13)$$
$$L_{QWP} \cdot L_{45°} \cdot L_{PM} \cdot L_{45°} \cdot L_p \cdot E_{in}$$
$$= \frac{1}{2\sqrt{2}} \begin{pmatrix} e^{i\phi} e^{i2\theta_f} + e^{i\phi'} e^{-i2\theta_f} \\ 0 \end{pmatrix}$$

Since the detected light is measured with the light amount by the photodetector 106, if the detected light amount is made into $P_{out}$, the detected amount $P_{out}$ can be expressed with the following equation 14 because the light amount is proportional to the square of the electric field.

$$P_{out} \equiv |E_{out}|^2 = \frac{1}{4}(1 + \cos((\phi + \phi') + 4\theta_f)) \quad (14)$$

Then, the detected light amount $P_{out}$ by the photodetector 106 is synchronously detected with the phase modulation angular frequency $\omega_m$ using a synchronous detection circuit 107. Here, if the detected light amount $P_{out}$ is developed by the higher harmonics of the phase modulation angular frequency $\omega_m$, $P_{out}$ becomes as the following equation 15.

$$P_{out} \equiv |E_{out}|^2 = \frac{1}{4}(1 + \cos((\phi - \phi') + 4\theta_f)) = \quad (15)$$
$$\frac{1}{4}(1 + \cos(\phi - \phi')\cos4\theta_f - \sin(\phi - \phi')\sin4\theta_f) =$$
$$\frac{1}{4}(1 + \cos(2\delta\sin\omega_m\alpha\cos\omega_m t_0)\cos4\theta_f -$$
$$\sin(2\delta\sin\omega_m\alpha\cos\omega_m t_0)\sin4\theta_f) =$$
$$\frac{1}{4}\left(1 + \left(J_0(R) + 2\sum_{n=1}^{\infty}(-1)^n J_{2n}(R)\cos2n\omega_m t_0\right)\cos4\theta_f\right) -$$
$$\frac{1}{4}\left(2\sum_{n=0}^{\infty}(-1)^n J_{2n+1}(R)\cos(2n+1)\omega_m t_0\right)\sin4\theta_f =$$
$$P_{0\omega} + P_{1\omega}\cos\omega_m t_0 + P_{2\omega}\cos2\omega_m t_0 + P_{3\omega}\cos3\omega_m t_0 +$$
$$P_{4\omega}\cos4\omega_m t_0 + P_{5\omega}\cos5\omega_m t_0 + P_{6\omega}\cos6\omega_m t_0 + \ldots$$

$P_{0\omega}$, $P_{1\omega}$, $P_{2\omega}$, $P_{3\omega}$, $P_{4\omega}$, $P_{5\omega}$, and $P_{6\omega}$ show the amplitude of the high harmonics, that is, zero-order harmonics, first-order harmonics, second-order harmonics, third-order harmonics, fourth-order harmonics, fifth-order harmonics and sixth-order harmonics, respectively when the synchronous detection of $P_{out}$ is carried out with the modulation angular frequency $\omega_m$, and the respective amplitudes become as the following equations 16 to 22.

$$P_{0\omega} = \frac{1}{4}(1 + J_0(R)\cos4\theta_f) \quad (16)$$

$$P_{1\omega} = -\frac{1}{2}J_1(R)\sin4\theta_f \quad (17)$$

$$P_{2\omega} = -\frac{1}{2}J_2(R)\cos4\theta_f \quad (18)$$

$$P_{3\omega} = +\frac{1}{2}J_3(R)\sin4\theta_f \quad (19)$$

$$P_{4\omega} = +\frac{1}{2}J_4(R)\cos4\theta_f \quad (20)$$

-continued $$P_{5\omega} = -\frac{1}{2} J_5(R)\sin 4\theta_f \quad (21)$$

$$P_{6\omega} = -\frac{1}{2} J_6(R)\cos 4\theta_f \quad (22)$$

where, $J_n$ is the n-th Bessel function and $R=2\delta \sin \omega_m \alpha$ is replaced.

Here, in the calculation, $t_0=(t-(\tau_2+\tau_1)/2)$, $\alpha=(\tau_2-\tau_1)/2$ are put, and the following equations 23 and 24 are used.

$$\cos(R\cos\phi) = J_0(R) + 2\sum_{n=1}^{\infty} (-1)^n J_{2n}(R)\cos 2n\phi \quad (23)$$

$$\sin(R\cos\phi) = 2\sum_{n=0}^{\infty} (-1)^n J_{2n+1}(R)\cos(2n+1)\phi \quad (24)$$

α can be expressed with the following equation 25 using a light path length $L_{opt}$ specified by time lag in which the two circular polarized lights propagating in the fiber, that is, the Faraday element, receive the phase modulation by the phase modulator.

$$\alpha = \frac{\tau_2 - \tau_1}{2} = \frac{1}{2} \cdot \frac{L_{opt}}{c} \quad (25)$$

In the case of the Sagnac interferometer-type fiber-optic current sensor shown in FIG. 1, the light propagation length from the modulation providing point of the phase modulator 105 to the mirror is expressed as L, and the refractive index of the fiber is expressed as $n_s$, the equation $L_{opt}=2\cdot n_s\cdot L$ can be obtained. Here, c is the velocity of light. Therefore, a is a system parameter which is decided uniquely by determining the light path length.

Next, the phase modulator driving circuit 108 feedback controls the phase modulator so that the absolute values of the amplitude of the second-order harmonics and the fourth-order harmonics which were synchronously detected with the phase modulation angular frequency $\omega_m$ by the synchronous detection circuit 107 become the same, that is, $|P_{2\omega}|=|P_{4\omega}|$. The feedback control is carried out so that $|P_{2\omega}|$ becomes equal to $|P_{4\omega}|$ by adjusting a modulation depth δ. The signal processing circuit 109 uses the amplitude $P_{3\omega}$ of the third-order harmonics as an output corresponding to the measured current.

Figure 3:
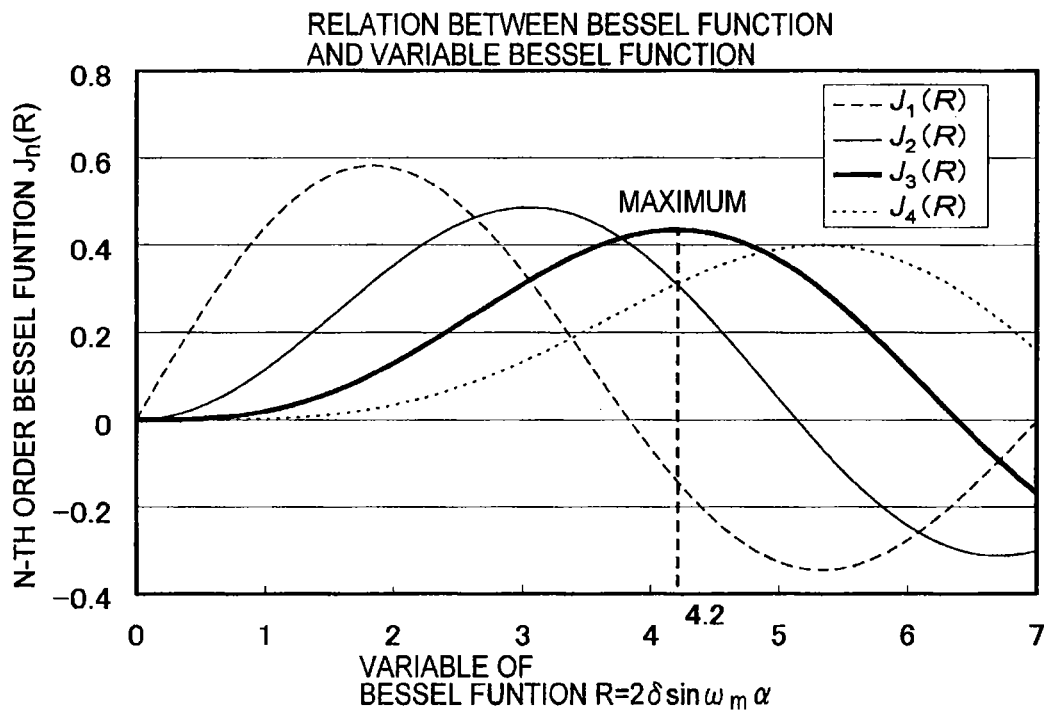
FIG. 3 is a figure showing a relation between the Bessel function and $R=2\delta \sin \omega_m \alpha$ according to the first embodiment of the present invention.
Figure 4:
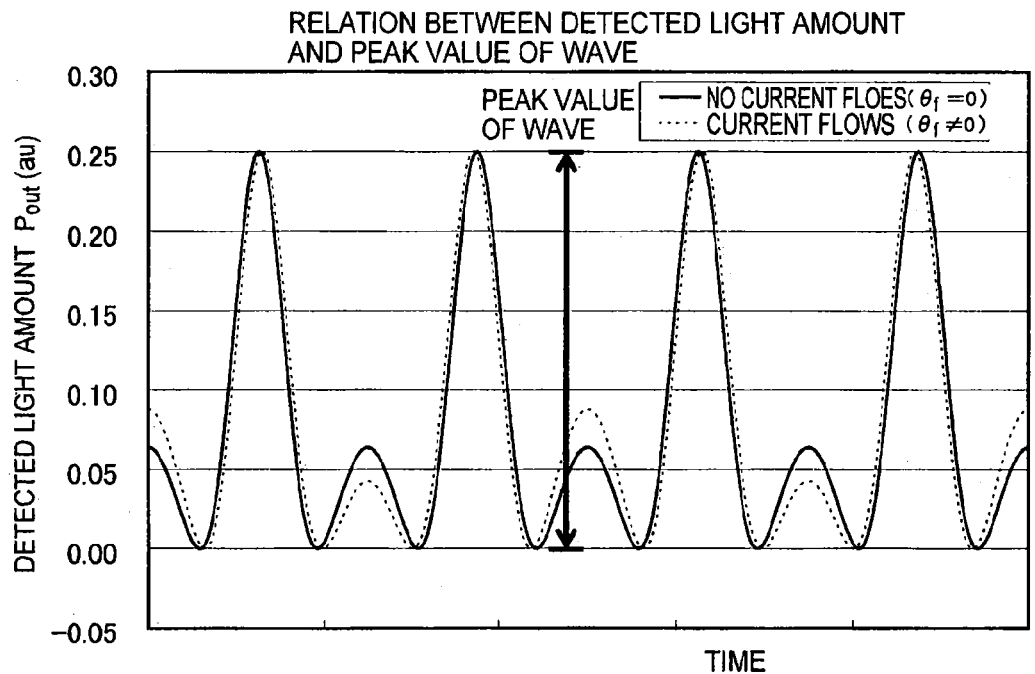
FIG. 4 is a figure showing a relation between the waveform of a light amount $P_{out}$ and a peak value of the wave detected by a detector according to the first embodiment of the present invention.

Here, in the phase modulator driving circuit 108, the reason why the feedback control is carried out so as to achieve $|P_{2\omega}|=|P_{4\omega}|$ is as follows. As shown in FIG. 3, when the values of the respective second and fourth Bessel functions are the same among the Bessel functions of the second, third and fourth Bessel functions, the third Bessel function becomes the maximum. Namely, when $|P_{2\omega}|=|P_{4\omega}|$, $|P_{3\omega}|$ becomes the maximum. Accordingly, a stable output without being easily affected by influence of noise can be obtained.

Moreover, even if the modulation efficiency of the phase modulator changes, the actually applied phase modulation can make constant by controlling the phase modulation depth so that the respective amplitudes of the second-order harmonics $P_{2\omega}$ and the fourth-order harmonics $P_{4\omega}$ become the same.

Figure 6:
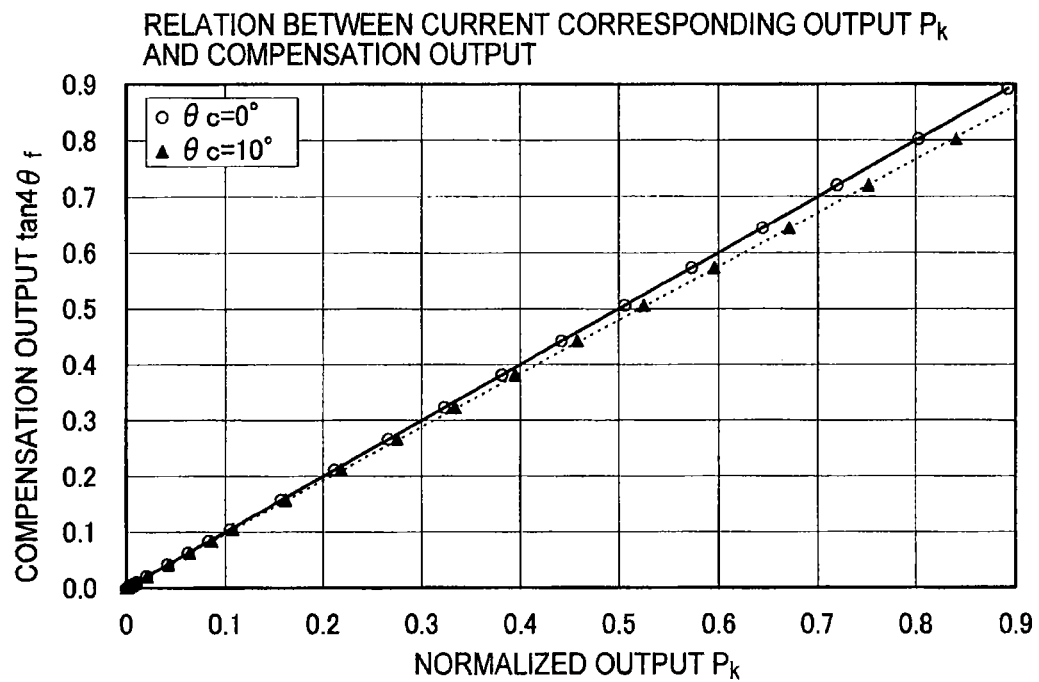
FIG. 6 is a figure showing a relation between a current corresponding output $P_k$ and $\tan 4\theta_f$ according to the first embodiment of the present invention. (in case $|P_{2\omega}|=|P_{4\omega}|$)

Here, when the emitted light amount from the light source or the light transmission loss in an optical circuit system changes, the light amount detected with the photodetector 106 usually changes. Therefore, a normalization circuit 109a of the signal processing circuit 109 normalizes $P_{3\omega}$ with a peak wave value of the light amount $P_{out}$ detected with the photodetector 106 as shown in FIG. 6 in order to obtain the output independent of the detected light amount.

There is other method to normalize $P_{3\omega}$ using the normalizing circuit 109a, that is, to normalize $P_{3\omega}$ by averaging the light amount $P_{out}$ detected with the photodetector 106 by passing the electric signal of $P_{out}$ in a low-pass filter with a suitable time constant. In this case, if a visibility of an optical system is not good, and much light from an optical element returns, a DC noise light is overlapped on the detected light amount. Therefore, the noise light causes an error at the time of normalizing. As a consequence, the above method is not suitable. However, it is also possible to normalize $P_{3\omega}$ with the averaged value of a half-wave rectified electrical signal of the detected light amount $P_{out}$ by passing the electrical signal of the detected light amount $P_{out}$ in a DC cut filter (high pass filter) with suitable time constant in order to remove the DC component of the detected light amount $P_{out}$.

The magnitude of $P_{3\omega}$ normalized by the signal of the detected light amount $P_{out}$ in this way becomes an output proportional to $\sin 4\theta_f$ as the equation 19. In the signal processing circuit 109, the $P_{3\omega}$ is outputted as a current corresponding output after carrying out an arcsine compensation to the normalized $P_{3\omega}$.

Here, the normalization to the third-order harmonics $P_{3\omega}$ by the normalizing circuit 109a of the signal processing circuit 109 is practically explained with reference to FIG. 5. Hereinafter, a practical problem for normalization, and a normalizing method by the normalizing circuit 109a of the signal processing circuit 109 are described in detail in order to solve the problem.

First, the sensor head unit 300 and the signal processing unit 100 are practically separated at point A of the light transmitting fiber 200 as shown in FIG. 1 and are again optically connected at the same point A. This is because the locations where the sensor head unit 300 and the signal processing unit 100 are installed are generally apart from each other, and in the state where the sensor head unit 300 and the signal processing unit 100 are optically connected by the light transmitting fiber 200 without being separated, the construction efficiency is not good.

Therefore, convenience is secured as follows. First, the sensor head unit 300 and the signal processing unit 100 are separated at point A in FIG. 1. After the respective installments completed, the separated light transmitting fibers (polarization maintaining fibers) 200 are optically connected again by a fusion splice method or a light connector.

However, in the above connection method, the out of alignment of the respective optic axis of the light transmitting fibers 200 (polarization maintaining fibers) at the time of coupling causes a problem. In the fusion splice method, since the out of alignment of the respective optical axis of the light transmitting fiber 200 (polarization maintaining fiber) is comparatively small, the misalignment is getting to be controlled. However, the fusion splice method requires a fusion splice machine for exclusive use, and still a small axial misalignment of optic axis remains in fact.

Under such circumstances, a Sagnac interferometer-type fiber-optic current sensor using the optical connector is desired in which the connection between the mutual polarization maintaining fibers is comparatively easy, and even if the out of the alignment of optic axes of the light connector is generated, the output is stable and a high accuracy measurement is achieved.

Here, as for the general optical connector for the polarization maintaining fibers, the out of alignment of the optic axes of about ±1° is generated even in a excellent connector because the connection is mechanical. The optical misalignment of the optic axis is produced at the time of connection by the optical connector. Moreover, also when temperature changes, or vibration, etc. are applied to the optical connector, the optical misalignment is generated due to the mechanical connection.

Here, when the axial misalignment of the light transmitting fibers 200 (polarization maintaining fibers) is generated, a crosstalk occurs between the lights which propagate along two optic axes of the polarization maintaining fibers, which results in a decrease in a polarization extinction ratio. Consequently, it is apparent that the sensitivity of the optical current sensor changes. Therefore, in constituting a highly precise optical current sensor, difficulty has been followed when the optical connector is used to optically connect the light transmitting fiber 200 (polarization maintaining fiber) until now.

Hereinafter, assuming that the axial misalignment of the optical axis takes place between the polarization maintaining fibers at point A in FIG. 1, the result of having analyzed the behavior of the light is explained below.

It supposed that the polarization maintaining fibers are optically connected by the optical connector especially at point A in FIG. 1, and the axial misalignment of only angle $\theta_c$ of the optical axis in the polarization maintaining fibers is generated at the connecting point A (equivalent to an optical axis rotation by only angle $-\theta_c$ at the point A because the polarization maintaining fibers are connected by making the optical axes rotate by $\theta_c$ with respect to an incident direction angle). In this case, the Jones matrix showing the behavior of the light at point A is expressed with the following equation 26.

$$L_A = \begin{pmatrix} \cos\theta_c & -\sin\theta_c \\ \sin\theta_c & \cos\theta_c \end{pmatrix} \quad (26)$$

Here, the change of $\theta_c$ is equivalent to that of the polarization extinction ratio $\gamma$ between the respective polarization maintaining fibers, that is, between the phase modulator and the quarter-wave plate, and a relation $\gamma=\tan^2\theta_c(|\theta_c|\leq 45°)$ is formed. Therefore, if $\theta_c$ increases, the polarization extinction ratio $\gamma$ also increases, that is, ratio $\gamma$ deteriorates.

As a consequence, when the electric field component of the light emitted from the light source is expressed with the above equation 1, the electric field component $E_{out}$ of the light which reaches to the photodetector 106 is expressed with the following equation 27.

$$E_{out} = L_P \cdot L_{45°} \cdot L_{PM'} \cdot L_A \cdot L_{45°} \cdot \quad (27)$$
$$L_{QWP} \cdot L_{F'} \cdot L_M \cdot L_F \cdot L_{QWP} \cdot L_{45°} \cdot L_A \cdot L_{PM} \cdot L_{45°} \cdot L_P \cdot E_{in}$$
$$= \frac{1}{2\sqrt{2}} \begin{pmatrix} (e^{i\phi}\cos\theta_c - \sin\theta_c)e^{i2\theta_f}(e^{i\phi'}\sin\theta_c + \cos\theta_c) + \\ (e^{i\phi}\sin\theta_c + \cos\theta_c)e^{-i2\theta_f}(e^{i\phi'}\cos\theta_c - \sin\theta_c) \\ 0 \end{pmatrix}$$

Therefore, the detection light amount $P_{out}$ of the light detected with the photodetector 106 becomes the following equation 28.

$$P_{out} = |E_{out}|^2 = \frac{1}{4}(1 + \cos((\phi - \phi') + 4\theta_f)) + \quad (28)$$
$$\left[\frac{1}{4}(-\cos^2 2\theta_f \sin^2 2\theta_c(\cos(\phi + \phi') + \cos(\phi - \phi')) + \right.$$
$$\left. 2\sin 4\theta_f \sin^2\theta_c \sin(\phi - \phi'))\right]$$

The light amount $P_{out}$ detected by the photodetector 106 is synchronously detected with the phase modulation angular frequency $\omega_m$ by the synchronous detection circuit 107 as mentioned above. Accordingly, the light amount $P_{out}$ detected with the higher harmonics of the phase modulation angular frequency $\omega_m$ is developed by the following equation 29.

$$P_{out} = |E_{out}|^2 = \frac{1}{4}(1 + \cos((\phi - \phi') + 4\theta_f)) + \quad (29)$$
$$\left[\frac{1}{4}(-(\cos(\phi + \phi') + \cos(\phi - \phi'))\sin^2 2\theta_c \cos^2 2\theta_f + \right.$$
$$\left. 2\sin(\phi - \phi')\sin^2\theta_c \sin 4\theta_f)\right] =$$
$$\frac{1}{4}(1 + \cos(\phi - \phi')\cos 4\theta_f - \sin(\phi - \phi')\sin 4\theta_f) +$$
$$\left[\frac{1}{4}(-(\cos(\phi + \phi') + \cos(\phi - \phi'))\sin^2 2\theta_c \cos^2 2\theta_f)\right] +$$
$$\left[\frac{1}{2}\sin(\phi - \phi')\sin^2\theta_c \sin 4\theta_f\right] =$$
$$\frac{1}{4}(1 + \cos(2\delta\sin\omega_m\alpha\cos\omega_m t_0)\cos 4\theta_f -$$
$$\sin(2\delta\sin\omega_m\alpha\cos\omega_m t_0)\sin 4\theta_f) +$$
$$\left[\frac{1}{4}(-(\cos(2\delta\cos\omega_m\alpha\sin\omega_m t_0) + \cos(2\delta\sin\right.$$
$$\left.\omega_m\alpha\cos\omega_m t_0))\sin^2 2\theta_c\cos^2 2\theta_f)\right] +$$
$$\left[\frac{1}{2}\sin(2\delta\sin\omega_m\alpha\cos\omega_m t_0)\sin^2\theta_c\sin 4\right.$$
$$\left.\theta_f\right] = \frac{1}{4}\left(1 + \left(J_0(R) + 2\sum_{n=1}^{\infty}(-1)^n\right.\right.$$
$$\left.\left.J_{2n}(R)\cos 2n\omega_m t_0\right)\cos 4\theta_f\right) -$$
$$\frac{1}{4}\left(2\sum_{n=0}^{\infty}(-1)^n J_{2n+1}(R)\cos(2n+1)\omega_m t_0\right)$$
$$\sin 4\theta_f + \left[-\frac{1}{4}\left(J_0(R') + 2\sum_{n=1}^{\infty}J_{2n}\right.\right.$$
$$(R')\cos 2n\omega_m t_0)\sin^2 2\theta_c\cos^2 2\theta_f] +$$
$$\left[-\frac{1}{4}\left(J_0(R) + 2\sum_{n=1}^{\infty}(-1)^n J_{2n}(R)\right.\right.$$
$$\left.\cos 2n\omega_m t_0\right)\sin^2 2\theta_c\cos^2 2\theta_f\right] +$$
$$\left[\frac{1}{2}\left(2\sum_{n=0}^{\infty}(-1)^n J_{2n+1}(R)\cos(2\right.\right.$$
$$\left.\left.n+1)\omega_m t_0\right)\sin^2\theta_c\sin 4\theta_f\right] = P_{0\omega} +$$
$$P_{1\omega}\cos\omega_m t_0 + P_{2\omega}\cos 2\omega_m t_0 +$$

-continued $$P_{3\omega}\cos 3\omega_m t_0 + P_{4\omega}\cos 4\omega_m t_0 +$$
$$P_{5\omega}\cos 5\omega_m t_0 + P_{6\omega}\cos 6\omega_m t_0 + \ldots$$

Here, $P_{0\omega}$, $P_{1\omega}$, $P_{2\omega}$, $P_{3\omega}$, $P_{4\omega}$, $P_{5\omega}$, and $P_{6\omega}$, respectively show the amplitudes of the zero-order harmonics, first-order harmonics, second-order harmonics, third-order harmonics, fourth-order harmonics, fifth-order harmonics, and sixth-order harmonics at the time of having carried out the synchronous detection of the $P_{out}$ with the modulation angular frequency $\omega_m$. They are expressed with the following equations 39 to 36, respectively.

$$P_{0\omega} = \frac{1}{4}(1 + J_0(R)\cos 4\theta_f) + \left[-\frac{1}{8}(J_0(R) + J_0(R'))\sin^2 2\theta_c \cos^2 2\theta_f\right] \quad (30)$$

$$P_{1\omega} = -\frac{1}{2}J_1(R)\sin 4\theta_f + \left[+\frac{1}{2}J_1(R)\sin^2\theta_c \sin 4\theta_f\right] \quad (31)$$

$$P_{2\omega} = -\frac{1}{2}J_2(R)\cos 4\theta_f + \left[+\frac{1}{4}(J_2(R) - J_2(R'))\sin^2 2\theta_c \cos^2 2\theta_f\right] \quad (30)$$

$$P_{3\omega} = +\frac{1}{2}J_3(R)\sin 4\theta_f + \left[-\frac{1}{2}J_3(R)\sin^2\theta_c \sin 4\theta_f\right] \quad (33)$$

$$P_{4\omega} = +\frac{1}{2}J_4(R)\cos 4\theta_f + \left[-\frac{1}{4}(J_4(R) + J_4(R'))\sin^2 2\theta_c \cos^2 2\theta_f\right] \quad (34)$$

$$P_{5\omega} = -\frac{1}{2}J_5(R)\sin 4\theta_f + \left[+\frac{1}{2}J_5(R)\sin^2\theta_c \sin 4\theta_f\right] \quad (35)$$

$$P_{6\omega} = -\frac{1}{2}J_6(R)\cos 4\theta_f + \left[+\frac{1}{4}(J_6(R) - J_6(R'))\sin^2 2\theta_c \cos^2 2\theta_f\right] \quad (36)$$

where $J_n$ is the n-th Bessel function, and the relations $R=2\delta \sin \omega_m \alpha$ and $R'=2\delta \cos \omega_m \alpha$ are put.

In addition, in the above calculation, the relation $t_0=t-(\tau_2+\tau_1)/2$, and $\alpha=(\tau_2-\tau_1)/2$ are put. Furthermore, in addition to the above equations 23 and 24, the relation of the following equation 37 is used.

$$\cos(R\sin\phi) = J_0(R) + 2\sum_{n=1}^{\infty} J_{2n}(R)\cos 2n\phi \quad (37)$$

In an ideal case of $\theta_c=0$, that is, when there is no out of alignment between the optic axis of the polarization maintaining fibers, the amplitudes of the harmonics become the formula in which the portion of [ ] in the equations 28 to 36 is removed, that is, the same as the equations 14 to 22.

In the Sagnac interferometer-type fiber-optic current sensor according to this embodiment as mentioned above, the feedback control is carried out so that $|P_{2\omega}|=|P_{4\omega}|$, and the amplitude of the third-order harmonics $P_{3\omega}$ is used as an output corresponding to the measured current.

Figure 5:
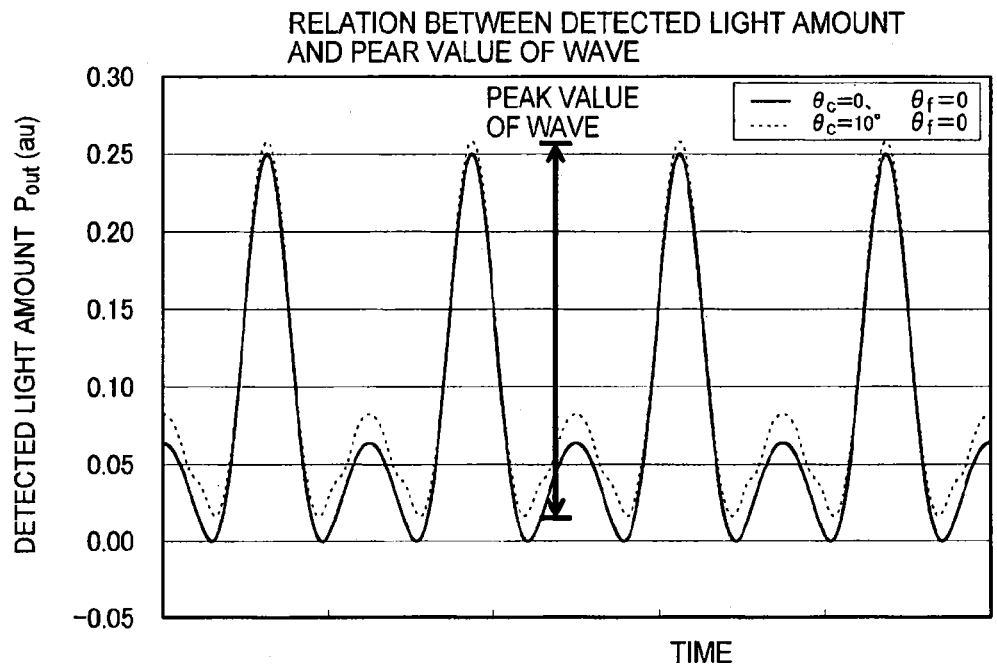
FIG. 5 is a figure showing a relation between the waveform of the light amount $P_{out}$ and the peak value of the wave detected with the detector corresponding to the magnitude of $\theta_c$ according to the first embodiment of the present invention.

However, in case $\theta_c$ is large, for example, $\theta_c=10°$, the waveform of $P_{out}$ calculated by the equation 29 is distorted as shown in FIG. 5 according to the above analysis results. Therefore, the normalization error of $P_{3\omega}$ becomes large if using the peak value of $P_{3\omega}$ or the half-wave rectified value by removing the DC component from the detected light amount $P_{out}$. As a result, even if an arcsine compensation is carried out to the normalized $P_{3\omega}$, the problem that the linearity with $\theta_f$, i.e., the measurement current I deteriorates is caused.

Furthermore, since the amplitude of the third-order harmonics $P_{3\omega}$ depends on the axial misalignment angle $\theta_c$ of the optic axis of the respective polarization maintaining fibers as shown in the equation 33, the output of the optical current sensor changes with $\theta_c$. That is, if the above is summarized, the following two points are raised as problems.

(1) Since the normalization of $P_{3\omega}$ using $P_{out}$ is accompanied with the distortion of the waveform of $P_{out}$, the linearity with $\theta_f$ becomes worse.

(2) The output of the optical current sensor changes with the magnitude of $\theta_c$.

Then, in this embodiment, the normalization circuit 109a of the signal processing circuit 109 normalizes $P_{3\omega}$ by dividing the $P_{3\omega}$ with one of $|P_{2\omega}|$, $|P_{4\omega}|$, and $|P_{6\omega}|$, or sum of $|P_{2\omega}|$ and $|P_{4\omega}|$ in order to solve above problems. In the Sagnac interference type optical current sensor according to the first embodiment, since the $P_{3\omega}$ is feedback controlled so as to $|P_{2\omega}|$, $|P_{4\omega}|$, the normalization of $P_{3\omega}$ with the $|P_{2\omega}|$ is equivalent to the normalization with $|P_{4\omega}|$.

Moreover, the normalization of $|P_{3\omega}|$ with the sum of $|P_{2\omega}|$ and $|P_{4\omega}|$ is also substantially equivalent to the normalization with $|P_{2\omega}|$ or $|P_{4\omega}|$. The normalization method using the sum of $|P_{2\omega}|$ and $|P_{4\omega}|$ is more suitable normalization method at the time of the feedback control to average the slight difference between $|P_{2\omega}|$ and $|P_{4\omega}|$. In addition, since the normalization of $P_{3\omega}$ with the sum of $|P_{2\omega}|$ and $|P_{4\omega}|$ is equivalent to the normalization with $|P_{2\omega}|$ or $|P_{4\omega}|$, the explanation is omitted.

Hereinafter, the reason why the normalization circuit 109a of the signal processing circuit 109 normalizes $P_{3\omega}$ by dividing the $P_{3\omega}$ with $|P_{2\omega}|$, $|P_{4\omega}|$, or $|P_{6\omega}|$, or sum of $|P_{2\omega}|$ and $|P_{4\omega}|$.

First, in the case the current is not flowing, that is, $\theta_f=0$, the odd-order harmonics at the time of carrying out the synchronous detection of the light detected with the photodetector 106 with the modulation angular frequency by the synchronous detection circuit 107 becomes "0", and only the even-order harmonics are detected as apparent from above equations 29 to 36. Therefore, the even-order harmonics are the signals reflecting the magnitude of the detected light amount. Furthermore, since $P_{2\omega}$ and $P_{4\omega}$ become the harmonics with the largest absolute values of the amplitude except for the zero-order harmonics among the even-order harmonics, $P_{2\omega}$ and $P_{4\omega}$ are signals effective in the normalization of $P_{3\omega}$ as compared with the higher even-order harmonics, In addition, since the influenced extent (change rate) of $P_{2\omega}$ and $P_{4\omega}$ with respect to $\phi_c$ is substantially the same as that of $P_{3\omega}$, the normalization of $P_{3\omega}$ with $|P_{2\omega}|$ or $|P_{4\omega}|$ is more stable to the change of $\theta_c$. Further, the change of the detected light amount accompanied with the change of the optical transmission loss of the optical system or the emitted light amount of the light source acts at the same rate to all the components of the harmonics signals to which the synchronous detection was carried out with the modulation angular frequency. Accordingly, the normalization value acquired by the above-mentioned normalization method is a value which is not affected by the influence of the change of the detected light amount.

On the other hand, although the zero-order harmonics is also a value reflecting the detected light amount, the harmonics becomes DC like and results in an error at the time of normalizing because the DC like noise light is overlapped on the detected light amount when the visibility of the optical system is not good, and there is much return light from the optical element. Accordingly, the zero-order harmonics is not suitable.

Moreover, sixth-order harmonics $P_{6\omega}$ is a signal effective in normalization of $P_{3\omega}$ and can be used. However, the magnitude of the even-order harmonics more than eighth-order is smaller as compared with the second-, fourth-, and sixth-order harmonics and tends to be affected by the influence of the noise. In addition, when the polarization extinction ratio change is large and the value of the current to be measured is also large, the polarity may be inverted. Accordingly, the even-order harmonics more than eighth-order are not suitable. In addition, although the sixth-order harmonics $P_{6\omega}$ is a signal effective in normalization of $P_{3\omega}$, it supposes that $P_{6\omega}$ is considered to be treated as the same way as the second-order harmonics $P_{2\omega}$ and the fourth-order harmonics $P_{4\omega}$. Accordingly the explanation about $P_{6\omega}$ is omitted.

Next, the embodiment in which the compensation circuit 109b of the signal processing circuit 109 carries out the arctangent compensation to the normalized output of harmonics as mentioned above is explained below with reference to FIGS. 6 to 8.

First, in the ideal case, that is, $\theta_c=0$, the normalized output $P_{3\omega}$ with $|P_{2\omega}|$ or $|P_{4\omega}|$ becomes an output proportional to tan $4\theta_f$. Therefore, the compensation circuit 109b of the signal processing circuit 109 carries out the arctangent compensation to the output proportional to tan $4\theta_f$. Accordingly, even in the case of the large current measurement under the condition that $\theta_f$ is large, it is possible to obtain a highly precise output.

Since the light detected with the photodetector 106 specifically follows the above equations 15 to 22 in the case of $\theta_c=0$, the current corresponding output $P_{3\omega}'$ which is obtained by normalizing $P_{3\omega}$ with $|P_{2\omega}|$ or $|P_{4\omega}|$ under the condition $|P_{2\omega}|=|P_{4\omega}|$, is expressed with the following equations 38 and 39.

$$P'_{3\omega} = \frac{P_{3\omega}}{|P_{2\omega}|} \quad (38)$$

$$= \frac{P_{3\omega}}{|P_{4\omega}|}$$

$$= k \cdot \tan\theta_f \quad (39)$$

where k is expressed with the following equation 40.

$$k = \frac{J_3(R)}{|J_2(R)|} = \frac{J_3(R)}{|J_4(R)|} (\approx 1.4) \quad (40)$$

According to the equation 40, the constant k does not depend on $\theta_f$, but is uniquely decided under the condition $|P_{2\omega}|=|P_{4\omega}|$, that is, $k\approx1.4$ (refer to FIG. 3). Therefore, if $P_k$ is replaced by the following equations 41 and 42, the following equations 43 and 44 are obtained.

$$P_k = \frac{P'_{3\omega}}{k} \quad (41)$$

$$\approx \frac{P'_{3\omega}}{1.4} \quad (42)$$

$$\theta_f = \frac{1}{4}\arctan P_k \quad (43)$$

$$= \frac{1}{4}\arctan\frac{P'_{3\omega}}{k}$$

$$\approx \frac{1}{4}\arctan\frac{P'_{3\omega}}{1.4} \quad (44)$$

According to above equations, the compensation circuit 109b of the signal processing circuit 109 can obtain $\theta_f$, i.e., the output proportional to the current I by carrying out the arctangent compensation to the current corresponding output $P_k$ which is obtained by dividing $P_{3\omega}'$ with the constant k (refer to above equation 7). In addition, since approximation of $\theta_f \approx P_k/4$ is realized in the area where the current I to be measured is small ($\theta_f \ll 1$), the compensation by arctangent can improve the measurement accuracy of the Sagnac interferometer-type fiber-optic current sensor in the area where the current I to be measured is large.

On the other hand, since the light detected with the photodetector 106 specifically follows the above equations 29 to 36 in the case of $\theta_c \neq 0$, the current corresponding output $P_k$ which is obtained by dividing $P_{3\omega}'$ with the constant $k\approx1.4$ under the condition $|P_{2\omega}|=|P_{4\omega}|$ like the case of $\theta_c=0$, is expressed with the following equations 45 and 46.

$$P_k = \frac{P_{3\omega}}{k|P_{2\omega}|} \quad (45)$$

$$= \frac{J_3(R)\sin 4\theta_f - 2J_3(R)\sin^2\theta_c\sin 4\theta_f}{k|-J_2(R)\sin 4\theta_f + (J_2(R) - J_2(R'))\sin^2 2\theta_c\cos^2 2\theta_f)|}$$

$$= \frac{P_{3\omega}}{k|P_{4\omega}|} \quad (46)$$

$$= \frac{J_3(R)\sin 4\theta_f - 2J_3(R)\sin^2\theta_c\sin 4\theta_f}{k|J_4(R)\cos 4\theta_f - (J_4(R) + J_4(R'))\sin^2 2\theta_c\cos^2 2\theta_f|)}$$

Here, the relation between $P_k$ and tan $4\theta_f$ shows a good linearity as shown in FIG. 6 because the respective change ratios of $P_{2\omega}$, $P_{4\omega}$, and $P_{3\omega}$ with respect to $\theta_c$ are almost the same. Therefore, it is effective to use the normalized value which is obtained by normalizing $P_{3\omega}$ with $|P_{2\omega}|$ or $|P_{4\omega}|$ as a current corresponding output to suppress deterioration of the linearity with $\theta_f$, i.e., the measurement current.

However, as shown in FIG. 6, in the case of $\theta_c \neq 0$, $P_k$ changes depending on the magnitude of $\theta_c$. Even if the compensation circuit 109b of the signal processing circuit 109 calculates the arctangent of $P_k$ obtained by the equations 45 and 46, an error is generated not a little. In addition, $P_k$ which is the value obtained by normalizing $P_{3\omega}$ with $|P_{2\omega}|$ or $|P_{4\omega}|$ shows a good linearity with tan $4\theta_f$. Therefore, highly precise measurement is realizable by calibrating with the current which satisfies the condition $4\theta_f \ll 1$ for every optical current sensor as far as $\theta_c$ is small or constant. However, such calibration method is not practical.

As shown in FIG. 6, although $P_k$ slightly changes with respect to tan $4\theta_f$ depending on the magnitude of $\theta_c$, $P_k$ is nearly proportional to tan $4\theta_f$, and tan $4\theta_f$ and $P_k$ are related as the following equation 47 using a coefficient k' (in an ideal case of $\theta_c=0$ and k'=1).

$$\tan 4\theta_f = k' \cdot P_k \quad (47)$$

Therefore, if the magnitude of $\theta_c$ and the change of k' by $\theta_c$ are known, tan $4\theta_f$ is able to be calculated using the equation 47. When the above equations 32 and 34 are compared with the equation 36, the magnitude of $\theta_c$ can be estimated using a value obtained by dividing the $|P_{2\omega}|$ or $|P_{4\omega}|$ with $|P_{6\omega}|$ employing the compensation circuit 109b of the signal processing circuit 109. Here, the attention is paid only about the even-order harmonics because the amplitude of the even-order harmonics does not become "0" even in the case of $\theta_f=0$.

In the above case, the value obtained by dividing the $|P_{2\omega}|$ or $|P_{4\omega}|$ with $|P_{6\omega}|$ is used as a cue to know the magnitude of $\theta_c$. However, other higher even-order harmonics can be also used in the same way. But, the magnitudes of the even-order harmonics more than eighth-order are small as compared with the second-, fourth-, and sixth-order harmonics, and they tend to be affected by the influence of the noise. In addition, when the change of the polarization extinction ratio or the crosstalk of the fiber is large and the value of the current to be measured is also large, the even-order harmonics more than eighth-order are not suitable because the polarity of the harmonics may be inverted.

Therefore, a method to estimate $\theta_c$ using $|P_{2\omega}|$, $|P_{4\omega}|$, and $|P_{6\omega}|$ can raise the measuring accuracy more. If a value obtained by dividing $|P_{2\omega}|$ or $|P_{4\omega}|$ with $|P_{6\omega}|$ is defined as $\eta$, $\eta$ is expressed with the following equation 48.

$$\eta = \frac{|P_{2\omega}|}{|P_{6\omega}|} = \frac{|P_{4\omega}|}{|P_{6\omega}|} \tag{48}$$

Here, $\eta$ becomes a function of $\theta_c$ and $\theta_f$ as apparent from the above equations 32, 34, and 36 under the condition of $|P_{2\omega}|=|P_{4\omega}|$. However, if the value of $\theta_c$ is small or constant, $\eta$ defined by the equation 48 hardly changes with respect to $\theta_f$ which satisfies $4\theta_f \ll 1$. Therefore, $\eta$ is approximately a function of $\theta_c$.

That is, in the case of $\theta_f=0$, $\eta$ is expressed with the following equation 49 under the condition $|P_{2\omega}|=|P_{4\omega}|$ from the above equations 32, 34, 36, and 48.

$$\eta = \frac{|P_{2\omega}|}{|P_{6\omega}|} \tag{49}$$

$$= \frac{|-J_2(R) + (J_2(R) - J_2(R'))\sin^2 2\theta_c|}{|-J_6(R) + (J_6(R) - J_6(R'))\sin^2 2\theta_c|}$$

$$= \frac{|P_{4\omega}|}{|P_{6\omega}|} \tag{50}$$

$$= \frac{|J_4(R) - (J_4(R) + J_4(R'))\sin^2 2\theta_c|}{|-J_6(R) + (J_6(R) - J_6(R'))\sin^2 2\theta_c|}$$

Figure 7:
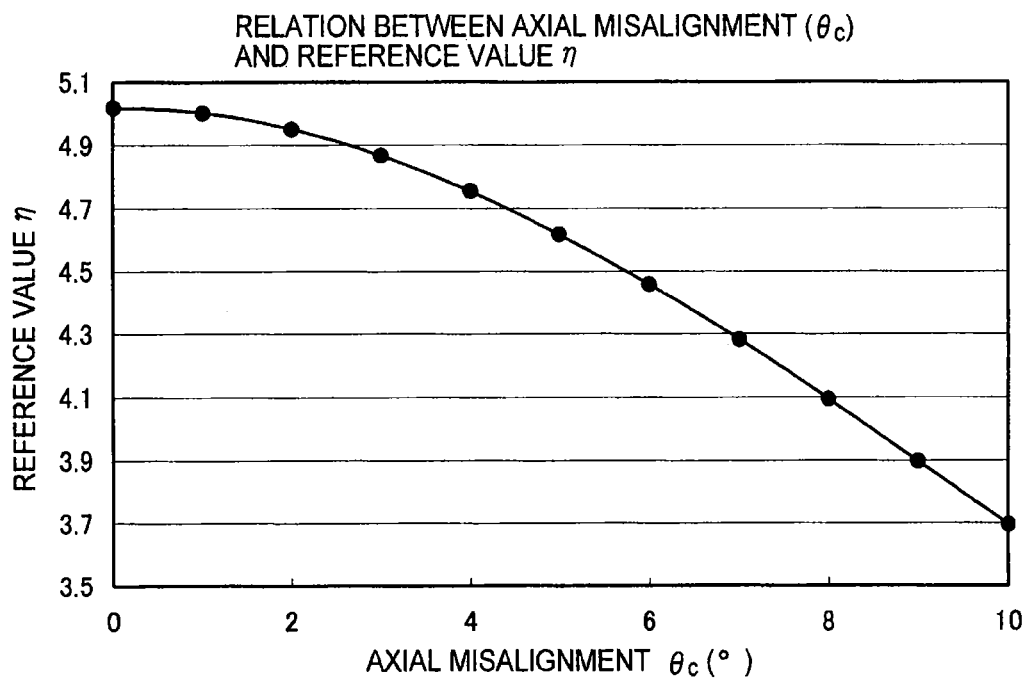
FIG. 7 is a figure showing a relation between $\theta_c$ and $\eta(\theta_c)$ according to the first embodiment of the present invention. (in case $\theta_f=0°$ and $|P_{2\omega}|=|P_{4\omega}|$)

Thus, the relation between $\theta_c$ and $\eta$ calculated by the equations 49 and 50 is shown in FIG. 7. According to FIG. 7, $\eta$ is decided uniquely by $\theta_c$ and it becomes possible to get to know the magnitude of $\theta_c$ approximately by measuring $\eta$. Thus, since $\theta_c$ can be approximately known from $\eta$, a relation between $\eta$ and k' related to $\theta_c$ is estimated, k' can be defined as follows from the above equation 47.

$$k' = \frac{\tan 4\theta_f}{P_k} \tag{51}$$

Figure 8:
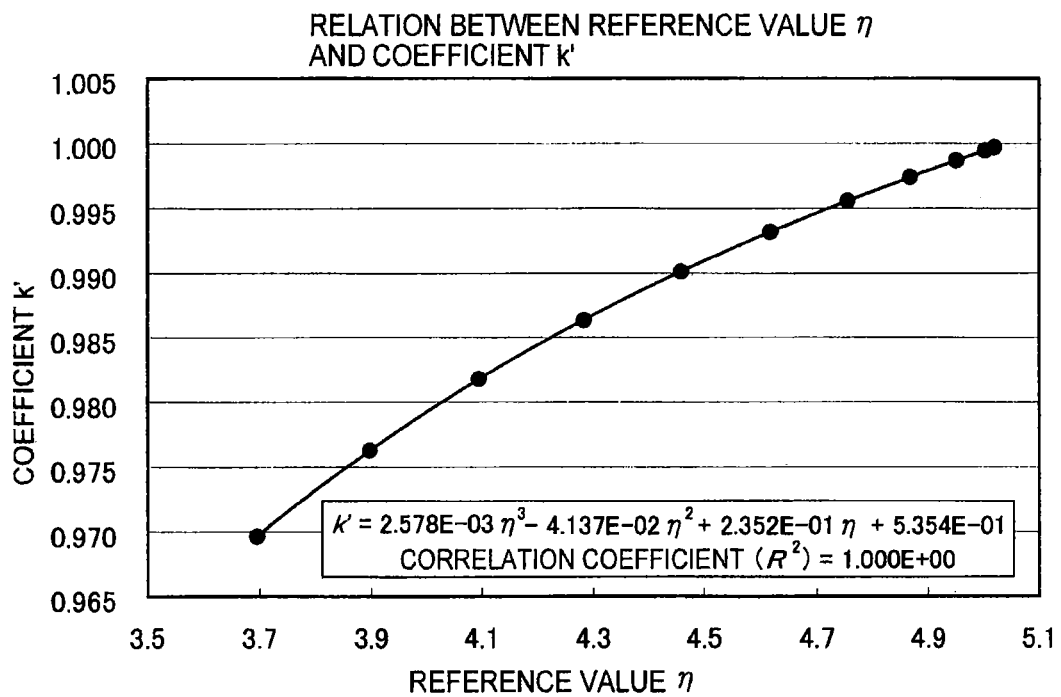
FIG. 8 is a figure showing a relation between $\eta$ and k' according to the first embodiment of the present invention. (in case $|P_{2\omega}|=|P_{4\omega}|$)
Figure 9:
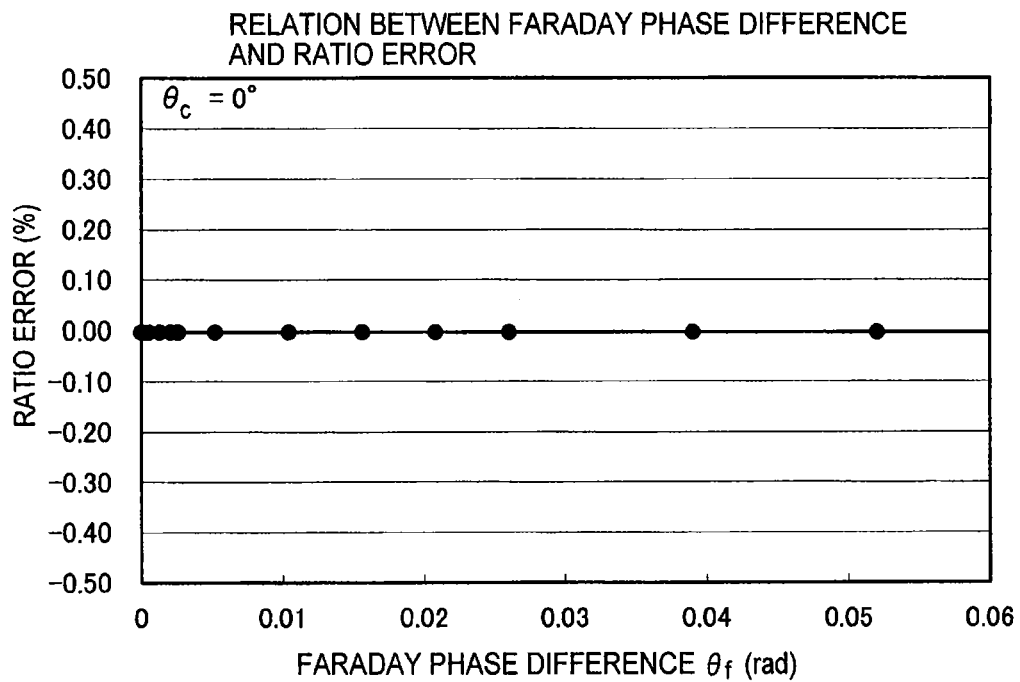
FIG. 9 is a figure showing a relation between $\theta_f$ generated by the measured current I and a ratio error according to the first embodiment of the present invention. (in case $\theta_c=0°$ and $|P_{2\omega}|=|P_{4\omega}|$)
Figure 10:
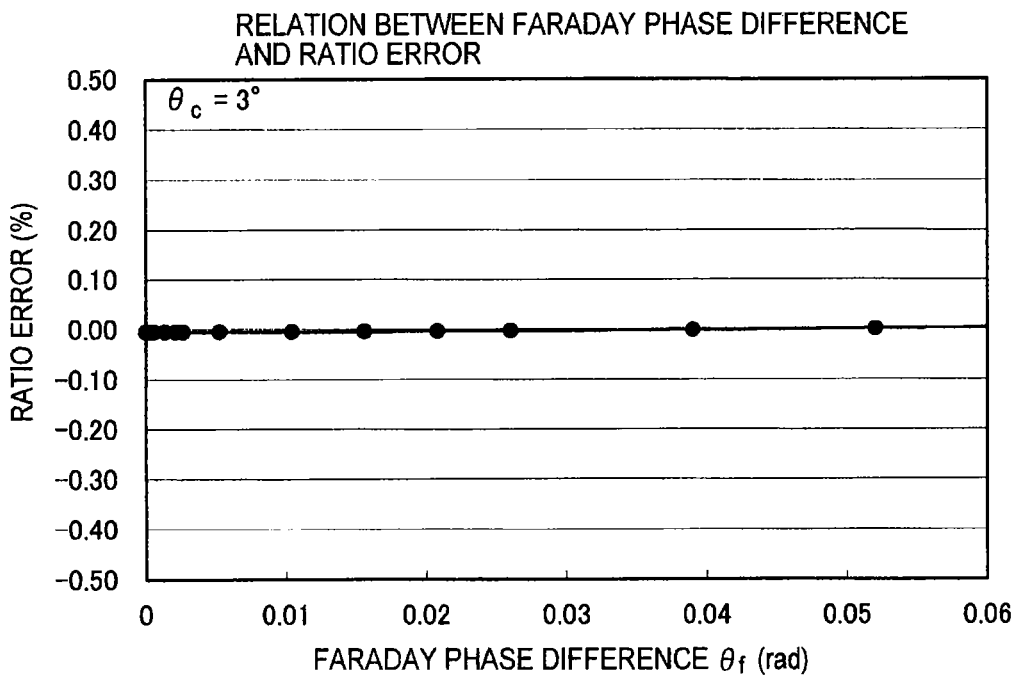
FIG. 10 is a figure showing a relation between $\theta_f$ generated by the measured current I and the ratio error according to the first embodiment of the present invention. (in case $\theta_c=3°$ and $|P_{2\omega}|=|P_{4\omega}|$)
Figure 11:
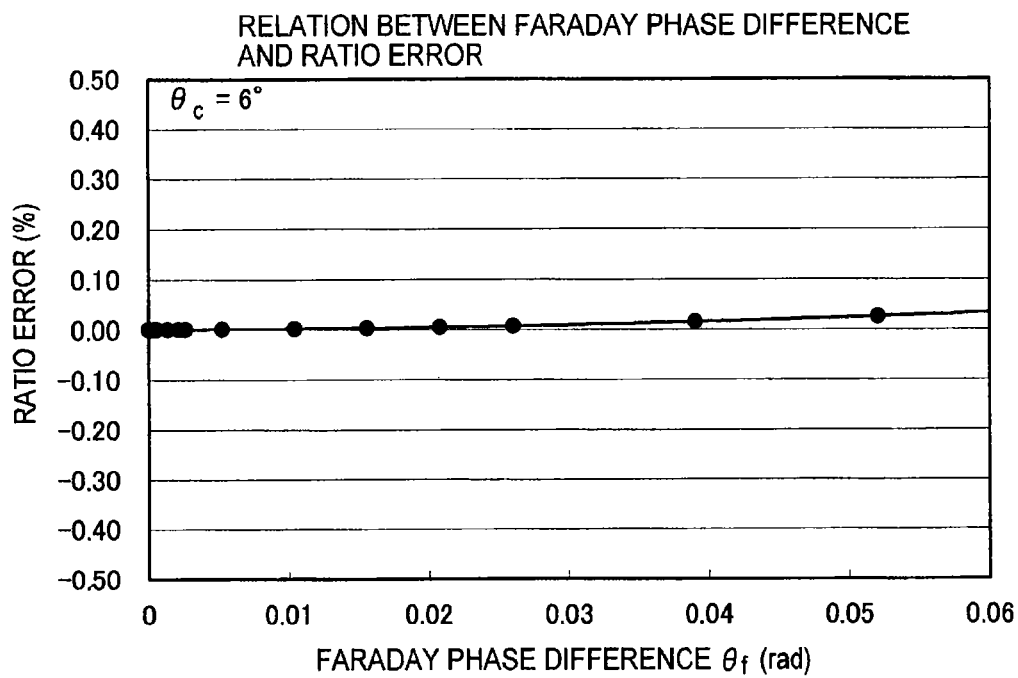
FIG. 11 is a figure showing a relation between $\theta_f$ generated by the measured current I and the ratio error according to the first embodiment of the present invention. (in case $\theta_c=6°$ and $|P_{2\omega}|=|P_{4\omega}|$)
Figure 12:
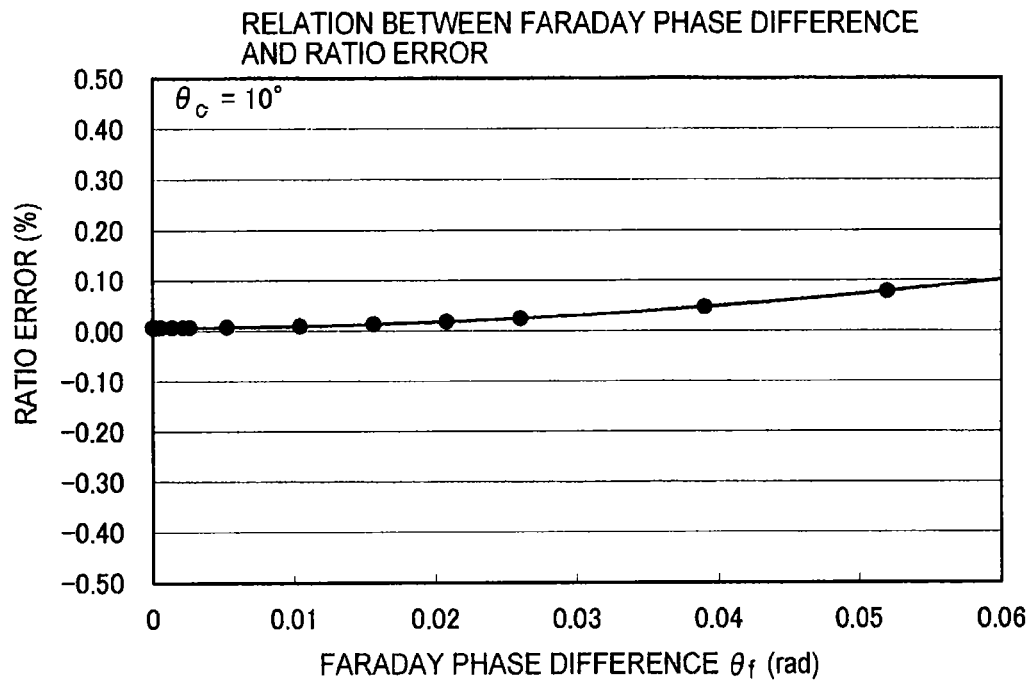
FIG. 12 is a figure showing a relation between $\theta_f$ generated by the measured current I and the ratio error according to the first embodiment of the present invention. (in case $\theta_c=10°$ and $|P_{2\omega}|=|P_{4\omega}|$)

First, k' for $\theta_f$ of a constant value which is not "0" and satisfies $4\theta_f \ll 1$ under condition of $|P_{2\omega}|=|P_{4\omega}|$ is obtained using the equation 51, and $\eta$ is also obtained by the equation 48. Consequently, the result of the estimation about the estimation between k' and $\eta$ is shown in FIG. 8. In this estimation, $4\theta_f=1.0405E-05$ (rad).

According to FIG. 8, k' can be approximately obtained and uniquely decided if $\eta$ defined by the equation 48 is used, and it turns out that the compensation by the third-order compensation is enough with respect to $\eta$. The estimated k' is expressed using $\eta$ with the following equation 52.

$$k'=2.578\times10^{-3}\cdot\eta^3 - 4.137\times10^{-2}\cdot\eta^2 + 2.352\times10^{-1}\cdot\eta + 5.354\times10^{-1} \tag{52}$$

If the $\theta_f$ is approximated under the condition $|P_{2\omega}|=|P_{4\omega}|$, the approximated value becomes the following equation 53 by the equations 47 and 52

$$\theta_f \approx \frac{1}{4}\arctan\left(\left(\sum_{n=0}^{3} a_n \cdot \eta^n\right) \cdot P_k\right) \tag{53}$$

where, $a_n$ is a constant, that is, the respective $a_0$ to $a_3$ are as follows. $a_0=5.354\times10^{-1}$, $a_1=2.352\times10^{-1}$, $a_2=-4.137\times10^{-2}$, and $a_3=2.578\times10^{-3}$.

Moreover, $P_k$ is expressed with the following equation 54, and $\eta$ is expressed with above equation 48.

$$P_k = \frac{1}{1.4} \cdot \frac{P_{3\omega}}{|P_{2\omega}|} = \frac{1}{1.4} \cdot \frac{P_{3\omega}}{|P_{4\omega}|} \tag{54}$$

Therefore, $\theta_f$ proportional to the measured current value I expected to be outputted finally can be obtained by using four harmonics $P_{2\omega}$, $P_{3\omega}$, $P_{4\omega}$, and $P_{6\omega}$ based on the equation 53. Thereby, according to the equation 53, in the case where the misalignment angular value of the polarization maintaining fibers is small or constant, that is, the polarization extinction ratio is small and constant, the approximation of $\theta_f \approx P_k/4$ is realized in the area where the current to be measured is small ($\theta_f \ll 1$). Furthermore, the arctangent compensation is carried out in the area where the current I to be measured is large. Accordingly, the measurement accuracy of the Sagnac interferometer-type fiber-optic current sensor can be improved.

Next, in order to show how much precisely the approximation by the above equation 53 is performed, the relation between $\theta_f$ and the ratio error with respect to the misalignment angle $\theta_c$ of the polarization maintaining fibers at Point A of FIG. 1 is shown in FIGS. 9 to 12 by defining the ratio error as the following equation 55.

$$\text{Ratio error (\%)} = \left(\frac{\frac{1}{4}\arctan\left(\left(\sum_{n=0}^{3} a_n \cdot \eta^n\right) \cdot P_k\right)}{\theta_f}\right) \times 100 \tag{55}$$

The approximate expression shown in the above equation 53 can realize highly precise approximation as shown in FIGS. 9 to 12, and it becomes possible to approximate the current of $\theta_f<0.06$ (rad) in the range of $\theta_c=0°$ to $10°$ with accuracy less than 0.1%. That is, according to the equation 53, a highly precise current measurement is realizable by compensating the output of the optical current sensor by the compensation circuit 109b.

For the reference, when a SLD with a wavelength of 830 nm is used for the light source in FIG. 1, and a quartz fiber is used for the sensing fiber, the Verdet constant number V of the quartz is $2.6\times10^{-6}$ (rad/A). Accordingly, if the number of turns n of the sensing fiber is made into one, the current magnitude in the range of $\theta_f<0.06$ (rad) corresponds to 23 kA or less.

According to the above first embodiment, the phase modulation depth of the second-order harmonics and the fourth-order harmonics obtained by carrying out the synchronous detection of the light amount detected with the photodetector 106 with the phase modulation angular frequency is controlled so that the respective amplitudes are set so as to be the same. Then, a compensation is carried out to the normalized amplitude of the third-order harmonics with the second-order harmonics, the fourth-order harmonics, or the sum of the second-order harmonics and the fourth-order harmonics using a value obtained by dividing the amplitude of the second-order harmonics or the fourth-order harmonics with the amplitude of the sixth-order harmonics. Further, the arctangent compensation is carried out to the compensated third-order harmonics, and the output of the arctangent of the compensated third-order harmonics is finally used as an output of the Sagnac interferometer-type fiber-optic current sensors. Accordingly, even if it is a case where the polarization extinction ratio of the light transmitting fiber 200 which connects the sensor head unit 300 and the signal processing unit 100 optically deteriorates, it becomes possible to offer the optical current sensor in which a highly precise current measurement is possible.

Furthermore, according to this embodiment, since the amplitudes of the second-order harmonics and the fourth-order harmonics are controlled so as to become the same, the third-order harmonics can be stably made into the maximum, and it becomes possible to make the third-order harmonics robust against the influence by a noise. Moreover, the phase modulation actually provided to the light can make constant by controlling the phase modulation depth so that the amplitudes of the second-order harmonics and the fourth-order harmonics become the same, even if the phase efficiency of the phase modulator changes.

Moreover, even if the detected light amount changes with the emitted light amount of the light source and optical transmission loss of the optical propagation path, etc., the stable output proportional to the measured current can be obtained by normalizing the third-order harmonics with the even-order harmonics. Especially, since the values of the second-order harmonics, the fourth-order harmonics, and the sixth-order harmonics are large compared with the amplitude of other high even-order harmonics, they cannot be easily affected by influence of the noise. In addition, even if the extinction ratio between the modulator and the quarter-wave plate changes, the normalized output using one of the amplitudes of the second-order harmonics, the fourth-order harmonics, and the sixth-order harmonics, or the sum of the amplitudes of the second-order harmonics and the fourth-order harmonics shows a good linearity with the measured current, if the value of the polarization extinction ratio between the modulator and the quarter-wave plate is small or constant.

Moreover, in the process for controlling the second-order harmonics and the fourth-order harmonics to the same value, the change direction of the second-order harmonics and the fourth-order harmonics is reverse. Accordingly, if the third-order harmonics is normalized with the sum of the amplitudes of the second-order harmonics and the fourth-order harmonics, it becomes possible to perform the normalization more stable than to perform the normalization of the third-order harmonics with the second-order harmonics or the fourth-order harmonics simply.

Furthermore, according to this embodiment, the signal processing circuit includes a compensation circuit to compensate the reference value using any two ratios between the amplitudes of the second-, fourth-, and the sixth-order harmonics, then outputs the compensated value by the compensation circuit as a signal proportional to the magnitude of the current to be measured.

According to above embodiment, even if the polarization extinction ratio between the phase modulator and the quarter-wave plate changes, it is possible to obtain the normalized value with a small sensitivity variation by compensating the normalized output using any two amplitudes of the second-, fourth- and sixth-order harmonics as mentioned above. As a result, it becomes possible not only to acquire the linearity of the input-output characteristic but also to control the sensitivity change of the optical current sensor. Accordingly, a highly precise Sagnac interferometer-type fiber-optic current sensor can be realized.

According to this embodiment, even if the polarization extinction ratio between the phase modulator and the quarter-wave plate changes, it is possible to obtain the compensated normalized output value with a small sensitivity variation by compensating the normalized reference value obtained by normalizing the odd-order harmonics obtained by carrying out the synchronous detection with any two of the second-, fourth- and sixth-order harmonics. As a result, it becomes possible not only to acquire the linearity of the input-output characteristic but also to control the sensitivity change of the optical current sensor. Accordingly, a highly precise Sagnac interferometer-type fiber-optic current sensor can be realized.

Moreover, the signal processing circuit includes the arctangent compensation circuit to carry out the compensation to the reference value or the compensated value, and outputs the compensated value by the above-mentioned arctangent compensation circuit as a signal proportional to the magnitude of the current to be measured.

Therefore, while a normalized output or a compensated normalization output is approximately proportional to the current to be measured in the area where the current to be measured is small, the arctangent value of the normalized output or the compensated normalization output is approximately proportional to the magnitude of the current to be measured in the area where the current to be measured is large. Therefore, also even in the area where the current to be measured is large, it becomes possible to improve the linearity of the input-output characteristic of the Sagnac interferometer-type fiber-optic current sensor by carrying out the arctangent compensation to the normalization output or the compensated normalization output. As a result, the measurement accuracy can be raised.

Furthermore, according to this embodiment, the optical filter includes the first Lyot type depolarizer formed of a polarization maintaining fiber and the polarizer configured using the polarization maintaining fiber optically connected with the phase modulator side. The phase modulator includes a polarization maintaining fiber to propagate the light defining the optic axes of the fiber. The polarization maintaining fibers mentioned above, which optically connect between the phase modulator and the polarizer, constitute the second Lyot type depolarizer. Moreover, the full length ratio between the first Lyot type depolarizer and the second Lyot type depolarizer is set 1:2n or 2n:1 using the positive integer n.

Therefore, the first Lyot type depolarizer enables to stabilize the output light amount from the polarizer. Moreover, since the ratio of the full length of the first Lyot type depolarizer to the full length of the second Lyot type depolarizer is set 1:2n or 2n:1 using the positive integer n, it becomes possible to set the group delay time lag of each depolarizer beyond a coherent time. Accordingly, it becomes possible to suppress the interference by the remaining polarization component in each depolarizer. As a result, it also becomes possible to suppress an optical phase drift and a zero point drift as the Sagnac interferometer-type fiber-optic current sensor.

Moreover, the optical filter is equipped with the polarizer and the first Lyot type depolarizer that is provided at the light source side of the polarizer and formed of the polarization maintaining fiber prepared for the purpose of specifying the optical axis of the polarizer and propagating the light.

Therefore, it is not necessary to provide an extra depolarizer by constituting the first Lyot type depolarizer using the polarization maintaining fiber of the polarizer prepared for the purpose of specifying an optical axis and propagating light regardless of the function of the polarizer. As a consequence, since the number of the points in which the respective fibers are connected optically also decreases, the characteristics such as optical connection loss, optical transmission loss, and a propagation polarization characteristic can be stabilized more, and the optical current sensor becomes more economical.

In addition, an optical crystal element may be used for optical elements such as the fiber coupler 103 which is an optical separation circuit, the depolarizer 104b, the polarizer 104a, and the quarter-wave plate 301 in the first embodiment, and it is possible to propagate the light in the space without using the fiber as the transmitting path (optical propagation path). For example, it is possible to use a beam splitter for the optical separation circuit, and a Glan-Thompson Prism etc. for the polarizer 104a.

In addition, Faraday elements formed of flint glass crystal, fibers or quartz crystal can be also used instead of the sensing fiber 302.

Moreover, in the above, although the third-order harmonics is used among the odd-order harmonics as a current corresponding output, other odd-order harmonics can be used to normalize in the same way. Moreover, in this embodiment, when normalizing the third-order harmonics as the current corresponding output, the second-order harmonics and fourth-order harmonics can be used as even-order harmonics. In addition, the second-order harmonics, fourth-order harmonics and the sixth-order harmonics are used for compensating the normalized output. Of course, higher even-order harmonics can be used in the same way.

Although the relation between $\eta$ and k' is obtained in a range of $|\theta_c| \leq 10°$ in FIG. 8, if the estimated change of $\theta_c$ is small, and the relation between $\eta$ and k' is obtained in the narrow range, the approximation accuracy of k' by $\eta$ is raised more. Moreover, the approximation order does not need to be the third-order, and if the higher order is used to approximate, the approximation accuracy is more raised.

In addition, although a digital processing circuit is commonly used as a practical circuit composition of the signal processing circuit 109, an analogue processing circuit can calculate the normalization in analog by using an analog divider. In case of the compensation, the signal processing circuit 109 can calculate the compensation by using an analog multiplier and an analog adder circuit. Moreover, in case of the arctangent compensation, it is also possible to carry out the arctangent compensation operation also using the analog multiplier and the analog adder circuit.

2. Second Embodiment

Next, the Sagnac interferometer-type fiber-optic current sensor according to the second embodiment is explained with reference to FIGS. 13 to 18. In the second embodiment, since the structures other than the phase modulator driving circuit 108 is the same as those of the first embodiment, the explanation is omitted and the same mark or symbol is denoted.

Figure 18:
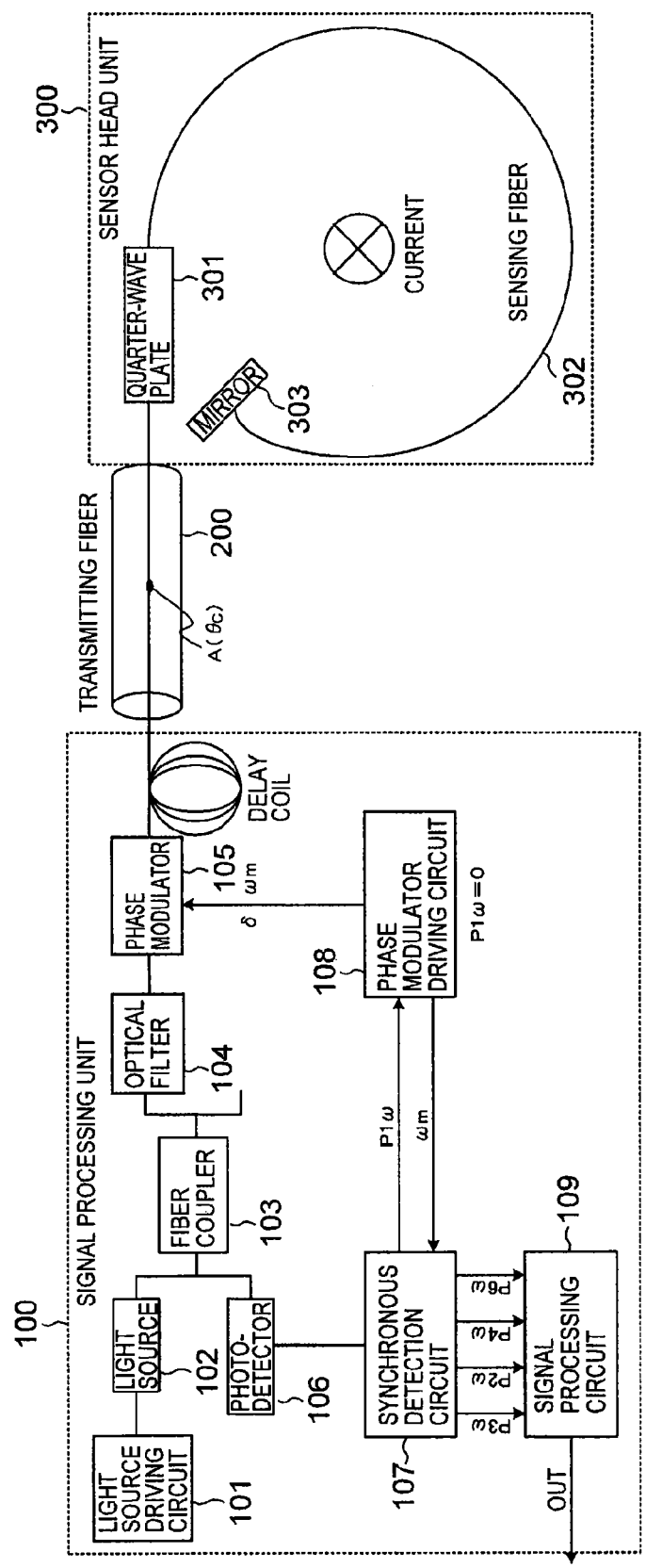
FIG. 18 is a figure showing a whole Sagnac interferometer-type fiber-optic current sensor structure according to the second embodiment of the present invention.
Figure 19:
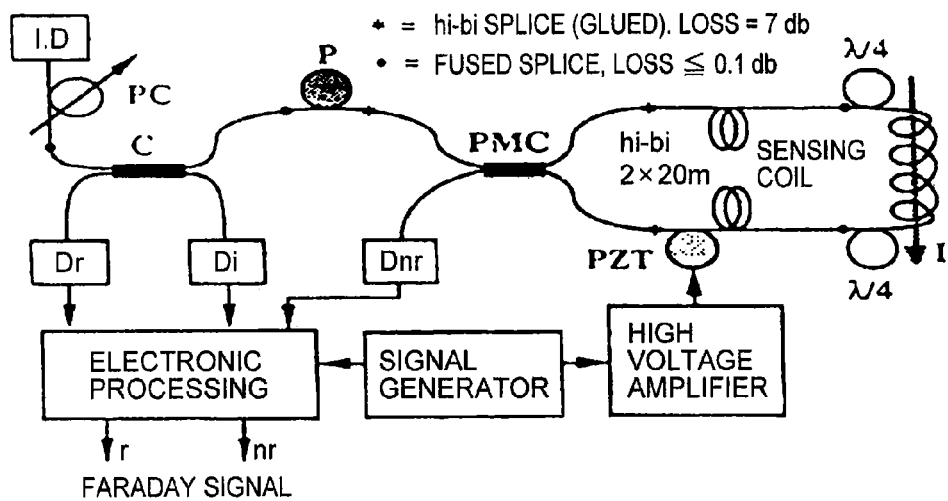
FIG. 19 to FIG. 24 are figures showing the structures of the conventional current sensors, respectively.
Figure 20:
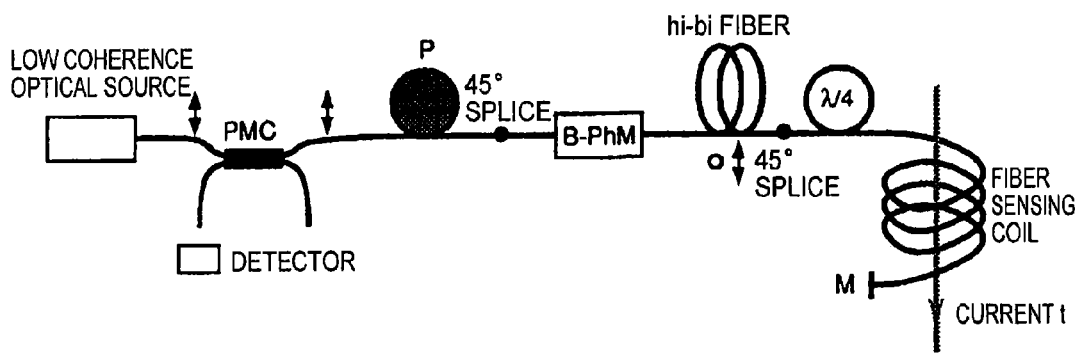
Figure 21:
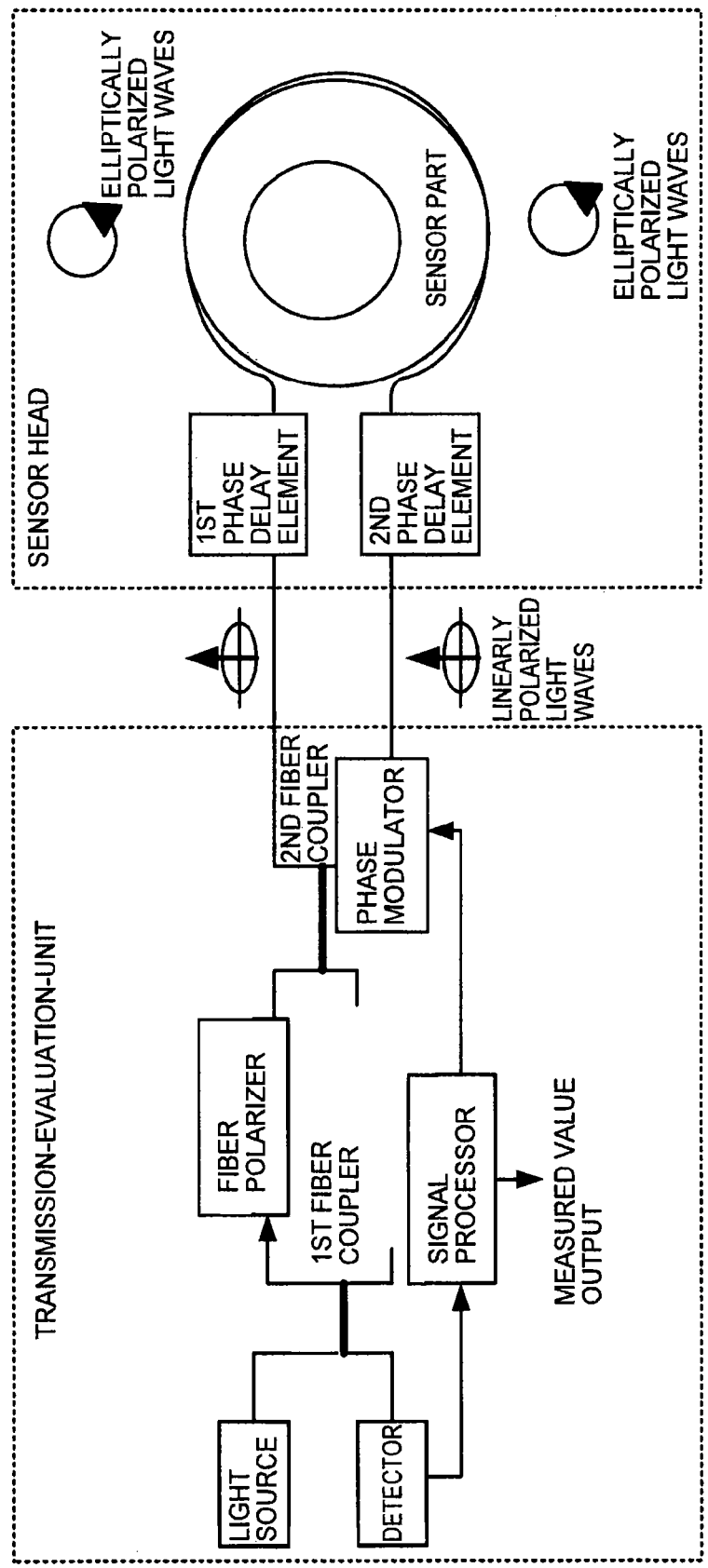
Figure 22:
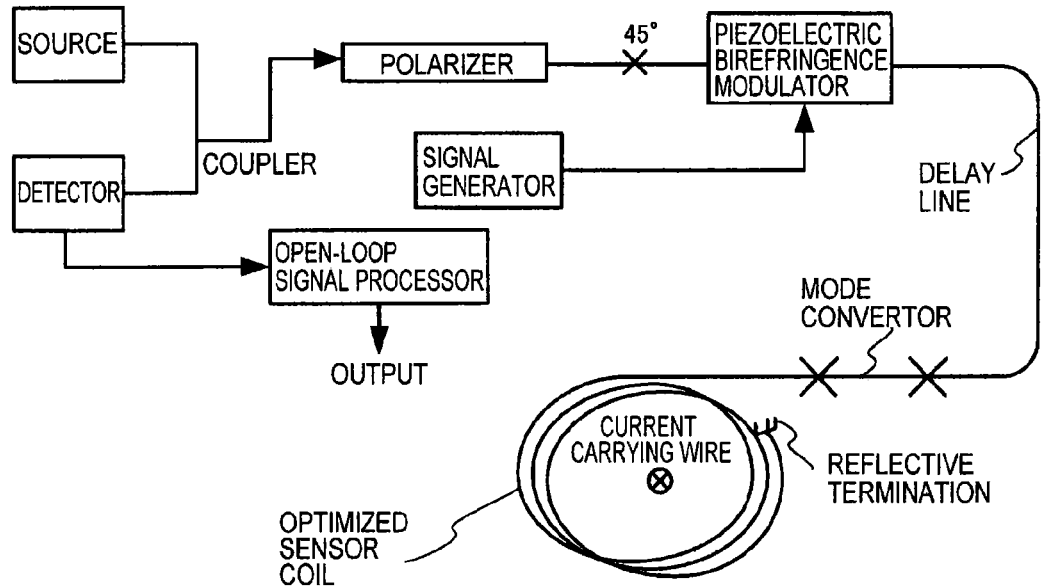
Figure 23:
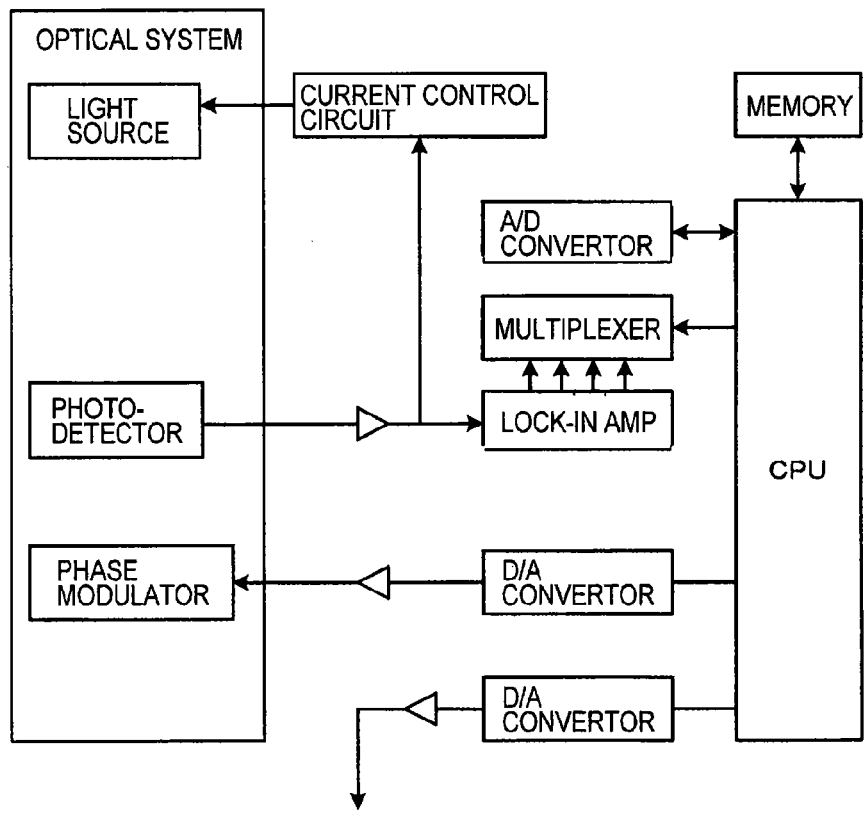
Figure 24:
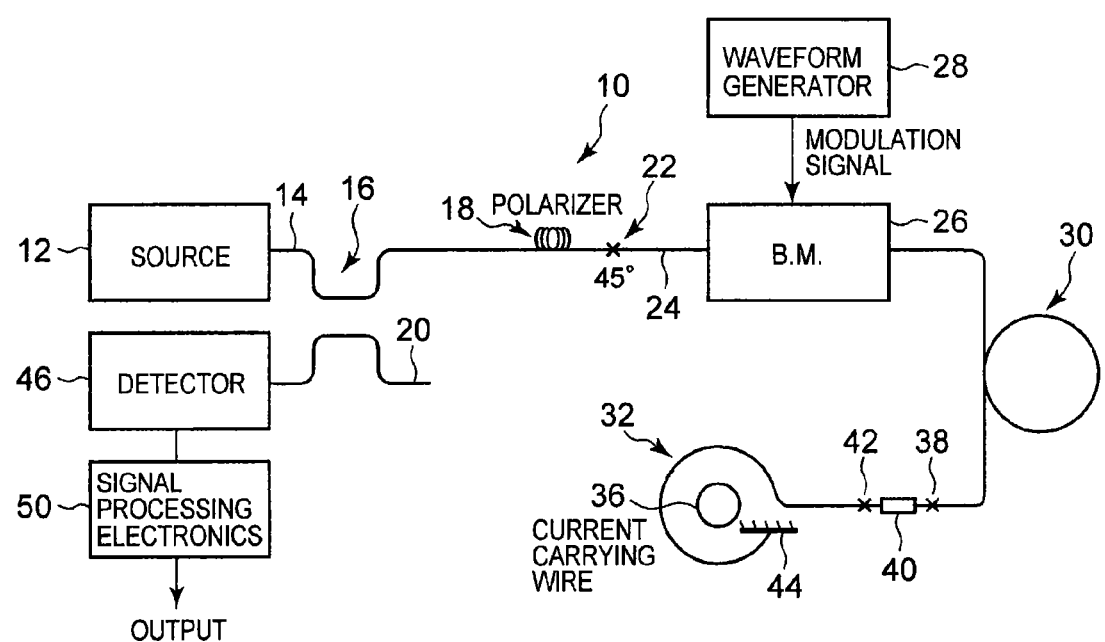

The feature of the second embodiment is to set $P_{1\omega}$ to "0" at all times by controlling the phase modulation depth $\delta$ using the phase modulator driving circuit 108 as shown in FIG. 18.

Next, the control of the phase modulation depth $\delta$ to set $P_{1\omega}$ to "0" by the phase modulator driving circuit 108 is explained hereinafter. In the explanation about the behavior of the light, the Jones matrix is used like the first embodiment.

First, in the above equation 31 showing the first-order harmonics, it is necessary to set $J_1(R)$ to "0" in order to set $P_{1\omega}$ to "0" regardless of the axial misalignment angle $\theta_c$ of the optic axis of the mutual polarization maintaining fibers at Point A in FIG. 1. Here, $J_1(R)$ is decided by $R = 2\delta \sin \omega_m \alpha$. Therefore, $\omega_m \alpha$ is obtained by dividing the product of the optical light path length ($L_{opt}$) specified by the time lag of time for two circular polarized lights propagating in the Faraday element to receive the phase modulation respectively by the phase modulator and the phase modulation angular frequency ($\omega_m$) with the twice as much velocity of the light (2c) (namely, $\omega_m \alpha = \omega_m L_{opt}/2c$) according to equation 25. Therefore, if the phase modulation angular frequency $\omega_m$ is decided, $\omega_m \alpha$ becomes a fixed value (constant value) decided exclusively.

As mentioned above, in the phase modulator driving circuit 108, it is necessary to control the phase modulation depth $\delta$ so as to $J_1(R)=0$ at all the times in order to set $P_{1\omega}$ to "0" at all the times. In other words, the phase modulator driving circuit 108 controls the phase modulation depth $\delta$ so that the $P_{1\omega}$ becomes "0" by providing a fixed phase modulation depth $\delta$ to the phase modulator.

Therefore, it becomes possible to keep the phase modulation actually applied to the light constant by controlling $P_{1\omega}$ to "0", even if the phase modulation efficiency of the phase modulator 105 changes with temperature or aged deterioration. Therefore, if the phase modulation depth $\delta$ actually applied to the light changes like equations 28 to 36, the output of the Sagnac interferometer-type fiber-optic current sensor also changes. However, even if the phase modulation efficiency changes, the output change of the Sagnac interferometer-type fiber-optic current sensor is suppressed by controlling $P_{1\omega}$ to "0".

For the reference, the control to set $P_{1\omega}$ to "0" is realized by controlling the phase modulation depth $\delta$ so as to $R = 2\delta \sin \omega_m \alpha \approx 3.83$.

Furthermore, as above-mentioned, since the phase modulator driving circuit 108 controls the modulation so that the $P_{1\omega}$ becomes "0", the order of odd-order harmonics that can be used as the current corresponding output is more than third-order. Since the amplitude of the third-order harmonics $P_{3\omega}$ is the largest, it becomes possible to make the influence by the noise small by using $P_{3\omega}$ as the current corresponding output.

Next, when the third-order harmonics $P_{3\omega}$ is controlled so that $P_{1\omega}$ becomes "0", the embodiments to carry out the normalization by dividing the third-order harmonics $P_{3\omega}$ with the amplitudes of the second-order harmonics, the fourth-order harmonics, and the sixth-order harmonics using the normalization circuit 109a, and to carry out the arctangent compensation using the compensation circuit 109b of the signal processing circuit 109 are explained as the first embodiment.

First, the third-order harmonics $P_{3\omega}$ when $P_{1\omega}$ is controlled to be set to "0" is normalized with $|P_{2\omega}|$, $|P_{4\omega}|$ or $|P_{6\omega}|$ like the first embodiment. Thereby, the stable normalized value can be obtained. The normalized value is not affected by the influence of change of the detected light amount accompanied with the change of the optical transmission loss of the optical system and the emitted light of the light source, and also is not affected by the change of $\theta_c$ of the Sagnac interferometer-type fiber-optic current sensor.

Practically, in the case of $\theta_c = 0$, the light detected with the detector follows the equations 15 to 22. Under the condition of $P_{1\omega} = 0$, the current corresponding output $P_{3\omega}'$ which is obtained by normalizing $P_{3\omega}$ with $|P_{2\omega}|$ is expressed with the following equations 56 and 57 as well as the equation 38.

In addition, since the normalization using the fourth-order harmonics or the sixth-order harmonics is carried out in the same way, the explanation is omitted. Moreover, the amplitudes of the even-order harmonics more than eighth-order harmonics is small compared with the second-order harmonics, fourth-order harmonics and sixth-order harmonics, and the harmonics tend to be affected by the influence of the noise. Furthermore, since the polarization extinction ratio change is large in the even-order harmonics more than eighth-order harmonics, the polarity of them may be inverted when the current value to be measured is large. Therefore, the even-order harmonics more than eighth-order harmonics are not applicable.

$$P'_{3\omega} = \frac{P_{3\omega}}{|P_{2\omega}|} \quad (56)$$

$$= k \cdot \tan\theta_f \quad (57)$$

where, k is expressed with the following equation 58.

$$k = \frac{J_3(R)}{|J_2(R)|} = (\approx 1.044) \quad (58)$$

According to the equation 58, k is a constant obtained exclusively regardless of $\theta_f$ under the condition $P_{1\omega}=0$, and becomes $k \approx 1.044$ (refer to FIG. 3).

Therefore, $\theta_f$ is expressed with the following equations 61 and 62 by putting $P_k$ with the following equations 59 and 60.

$$P_k = \frac{P'_{3\omega}}{k} \quad (59)$$

$$\approx \frac{P'_{3\omega}}{1.044} \quad (60)$$

$$\theta_f = \frac{1}{4}\arctan P_k = \frac{1}{4}\arctan\frac{P'_{3\omega}}{k} \quad (61)$$

$$\approx \frac{1}{4}\arctan\frac{P'_{3\omega}}{1.044} \quad (62)$$

As shown in the equations 61 and 62, an output $\theta_f$ proportional to the current I can be obtained by carrying out the arctangent compensation to the current corresponding output $P_k$ obtained by dividing $P_{3\omega}'$ with the constant k (refer to the equation 7). In addition, an approximation of $\theta_f \approx P_k/4$ is realized in the area where the current I to be measured is small ($\theta_f \ll 1$). That is, the arctangent compensation improves the measurement accuracy of the Sagnac interferometer-type fiber-optic current sensor in a region where the current I to be measured is large.

Next, in the case of $\theta_c \neq 0$, the current corresponding output $P_k$ obtained by dividing $P_{3\omega}'$ with the constant $k \neq 1.044$ like the case of $\theta_c=0$ follows the equations 29 to 36 as the case of $\theta_c=0$. The current corresponding output $P_k$ is expressed with the following equation 63 by the equations 56 and 59 under the condition of $P_{1\omega}=0$.

$$P_k = \frac{P_{3\omega}}{k|P_{2\omega}|} = \frac{J_3(R)\sin 4\theta_f - 2J_3(R)\sin^2\theta_c\sin 4\theta_f}{k|-J_2(R)\cos 4\theta_f + (J_2(R) - J_2(R'))\sin^2 2\theta_c\cos^2 2\theta_f)|} \quad (63)$$

Figure 13:
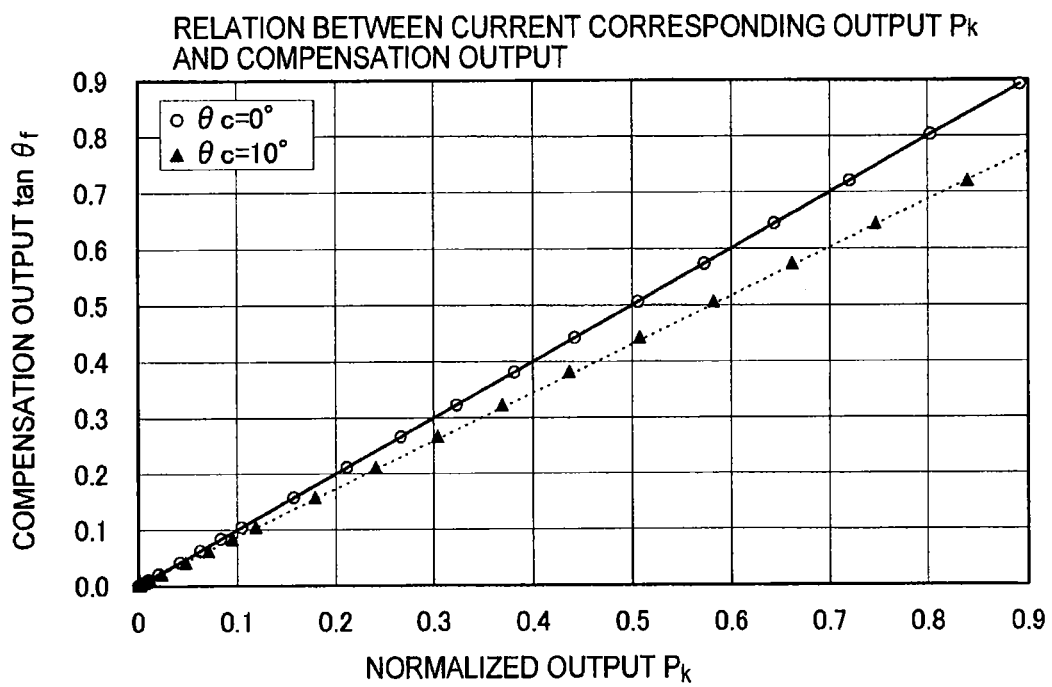
FIG. 13 is a figure showing a relation between the current corresponding output $P_k$ and $\tan 4\theta_f$ according to a second embodiment according to the present invention. (in case $|P_{1\omega}|=0$)

Since the change ratios of $P_{2\omega}$ and $P_{3\omega}$ to $\theta_c$ are comparable here, good linearity is shown between $P_k$ and $\tan 4\theta_f$ (refer to FIG. 13).

As mentioned above, it turns out that it is effective to use the value obtained by normalizing $P_{3\omega}$ with $|P_{2\omega}|$ as a current corresponding output in order to suppress the deterioration of the linearity with $\theta_f$, i.e., the measured current.

However, as shown in FIG. 13, in the case of $\theta_c \neq 0$, it turns out that change of $P_k$ is generated depending on the magnitude of $\theta_c$ (equivalent to a proportionality coefficient change of $P_k$ to $\tan 4\theta_f$). Therefore, even if the arctangent compensation is carried out to $P_k$ obtained by the equation 63, error is generated not a little.

In addition, since $P_k$ obtained by normalizing $P_{3\omega}$ with $|P_{2\omega}|$ shows a good linearity with $\tan 4\theta_f$, it is possible to precisely compensate the output corresponding to the current with a current which satisfies $4\theta_f \leq 1$ at every light current sensing operation after optically connecting the fibers at the point A in FIG. 1, if $\theta_c$ is small or constant even in the case of $\theta_c \neq 0$. However, such compensation is not practical.

Here, since the proportionality coefficient change k' of $P_k$ to $\tan 4\theta_f$ varies depending on the magnitude of $\theta_c$ slightly as shown in FIG. 13 (in the ideal case of $\theta_c=0$ and k'=1), $\tan 4\theta_f$, $P_k$, and k' are related like the following equation 64.

$$\tan 4\theta_f = k' \cdot P_k \quad (64)$$

Therefore, if the magnitude of $\theta_c$ is known and change of k' by $\theta_c$ is also known, it becomes possible to compensate the equation 64. If the above equations 32 and 34 are respectively compared with the equation 36, the respective changing ratios to $\theta_c$ can be estimated using a value obtained by dividing the $|P_{2\omega}|$ with $|P_{6\omega}|$.

Here, the attention is paid only about the even-order harmonics because the output does not become "0" even in the case of $\theta_f=0$ in the even-order harmonics. In the above case, although the value obtained by dividing $|P_{2\omega}|$ with $|P_{6\omega}|$ is used to know the magnitude of $\theta_c$ as a cue, it is also possible to use other even-order harmonics expect zero-order harmonics similarly.

However, in the even-order harmonics more than eighth-order harmonics, the amplitude is small compare with the second-, fourth-, and sixth-order harmonics. Accordingly, it is easier to be affected by the influence of the noise. Further, in case the polarization extinction ratio change is large, and the measured current is also large, the polarity of them may be inverted. As a consequence, the even-order harmonics more than the eighth-order harmonics are not applicable.

Therefore, the method to estimate $\theta_c$ using $|P_{2\omega}|$ $|P_{4\omega}|$ and $|P_{6\omega}|$ is superior to raise the measurement accuracy more. If the value obtained by dividing $|P_{2\omega}|$ with $|P_{6\omega}|$ is denoted by η, η can be expressed with the following equation 65.

$$\eta = \frac{|P_{2\omega}|}{|P_{6\omega}|} \quad (65)$$

Here, η becomes a function of $\theta_c$ and $\theta_f$ under the condition of $P_{1\omega}=0$ as apparent from the above equations 32 and 36. However, η defined by the equation 65 hardly changes under the condition that $\theta_c$ is small or constant with respect to $\theta_f$ which satisfies $4\theta_f \ll 1$. Accordingly, η is approximately estimated as a function of $\theta_c$.

Therefore, if the behavior of $\theta_c$ with respect to η is evaluated about arbitrary $\theta_f$ which satisfies $4\theta_f \ll 1$, and η is exclusively determined by $\theta_c$, the magnitude of $\theta_c$ can be approximately known by measuring η. That is, in the case of $\eta_f=0$, η is expressed with the following equation 66 under the condition of $P_{1\omega}=0$ from the above equations 32, 36, and 65.

$$\eta = \frac{|P_{2\omega}|}{|P_{6\omega}|} = \frac{|-J_2(R) + (J_2(R) - J_2(R'))\sin^2 2\theta_c|}{|-J_6(R) + (J_6(R) - J_6(R'))\sin^2 2\theta_c|} \quad (66)$$

Figure 14:
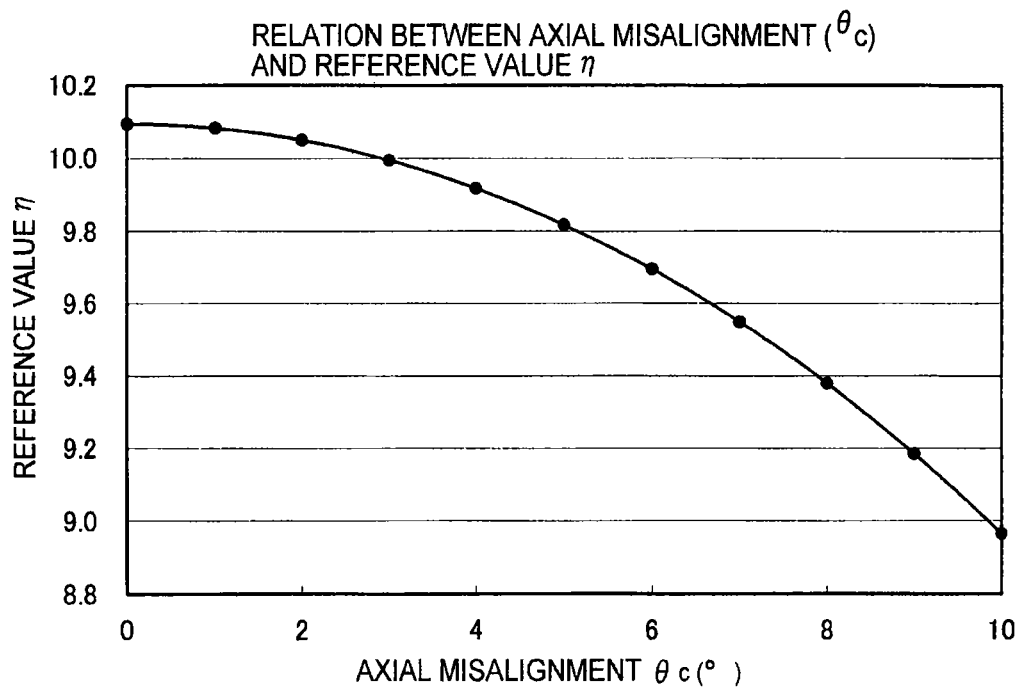
FIG. 14 is a figure showing the relation between $\theta_c$ and $\eta(\theta_c)$ according to the second embodiment of the present invention. (in case $\theta_f=0°$ and $P_{1\omega}=0$).

Thus, the relation between $\theta_c$ and $\eta$ calculated by the equation 66 is shown in FIG. 14. According to FIG. 14, $\eta$ is decided exclusively by $\theta_c$ and it becomes possible to get to know the magnitude of $\theta_c$ approximately by measuring $\eta$. Thus, since $\theta_c$ can be approximately known by $\eta$, then the relation between $\eta$ and k' related to $\theta_c$ is evaluated. k' can be defined as the following equation 64 by the above equation 64.

$$k' = \frac{\tan 4\theta_f}{P_k} \quad (67)$$

Figure 15:
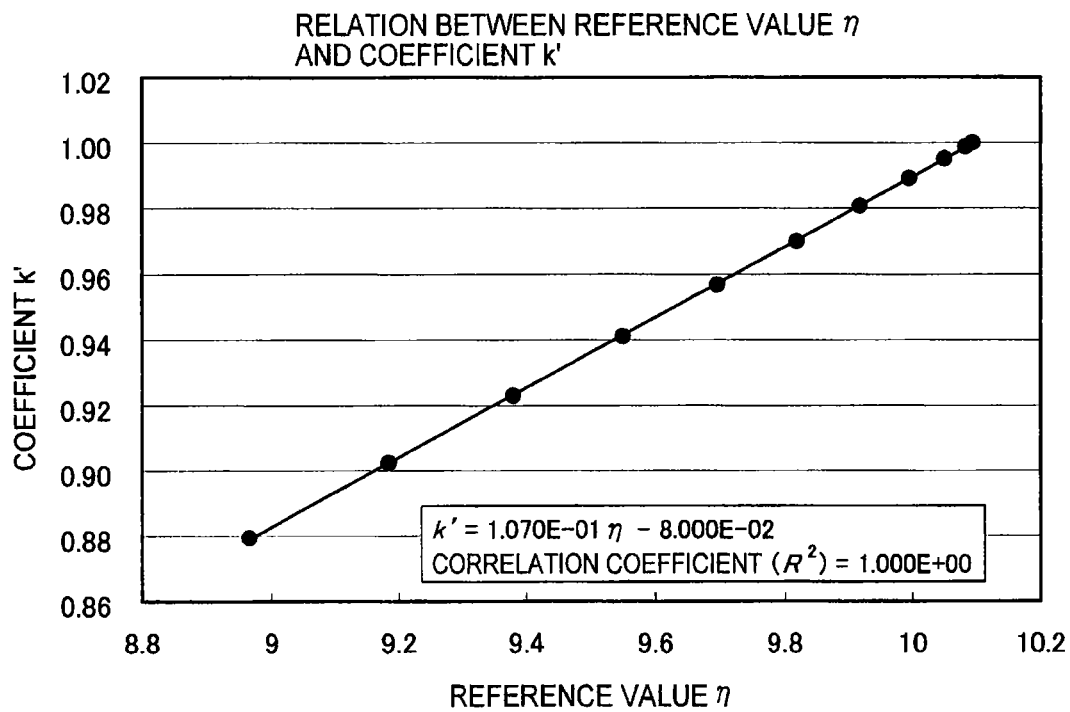
FIG. 15 is a figure showing a relation between $\eta$ and k' according to the second embodiment of the present invention. (in case $P_{1\omega}=0$)

FIG. 15 shows a result of the evaluation between k' and $\eta$ in which k' is obtained using the equation 67 with respect to the value of $\theta_f$ which is not "0" and satisfies $4\theta_f \ll 1$ under the condition $P_{1\omega}=0$, and $\eta$ is also obtained using the equation 65. In this evaluation, $4\theta_f=1.0405E-05$ (rad) is used.

As shown in FIG. 15, k' can be approximately and exclusively decided using $\eta$ defined by the equation 65, and it turns out that the compensation by the first-order is enough with respect to $\eta$. The evaluated k' is expressed as the following equation 68 using $\eta$.

$$k'=1.070\times 10^{-1}\cdot\eta - 8.000\times 10^{-2} \quad (68)$$

As described above, under the condition of $P_{1\omega}=0$, if $\theta_f$ is approximated by the equations 64 and 68, $\theta_f$ is expressed with the following equation 69.

$$\theta_f \approx \frac{1}{4}\arctan\left(\left(\sum_{n=0}^{1} a_n \cdot \eta^n\right) \cdot P_k\right) \quad (69)$$

where, $a_n$ is a constant, and $a_0=-8.000\times 10^{-2}$ and $a_1=1.070\times 10^{-1}$ are practically used.

Moreover, $P_k$ is expressed with the following equation 70, and $\eta$ is expressed with above equation 65.

$$P_k = \frac{1}{1.044} \cdot \frac{P_{3\omega}}{|P_{2\omega}|} \quad (70)$$

Therefore, $\theta_f$ proportional to the measured current value I to be outputted finally can be obtained based on the equation 69 by using three harmonics, $P_{2\omega}$, $P_{3\omega}$, and $P_{6\omega}$. In the case where the misalignment angle of the optic axes between the respective polarization maintaining fibers to be optically connected is small or constant (in the case the value of the polarization extinction ratio is small or constant), the approximation of $\theta_f \approx P_k/4$ is realized in the area where the current I to be measured is small ($\theta_f \ll 1$), and in the area where the current I to be measured is large, the arctangent compensation is carried out. Accordingly, the measurement accuracy of the Sagnac interferometer-type fiber-optic current sensor is improved.

Figure 16:
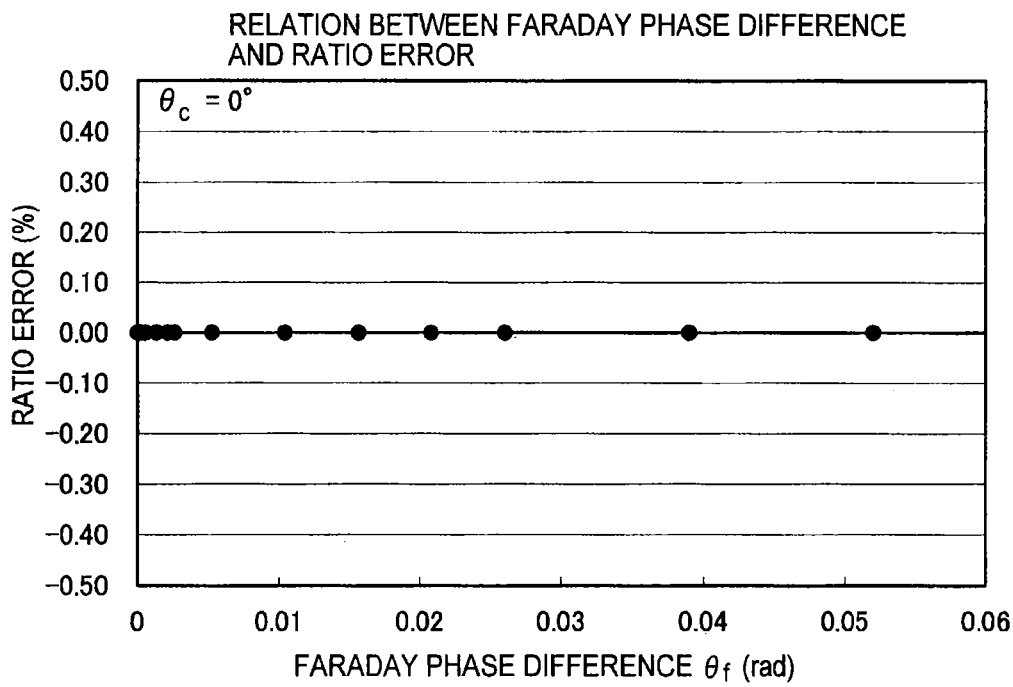
FIG. 16 is a figure showing a relation between $\theta_f$ generated by the measured current I and the ratio error according to the second embodiment of the present invention. (in case $\theta_c=0°$ and $P_{1\omega}=0$)
Figure 17:
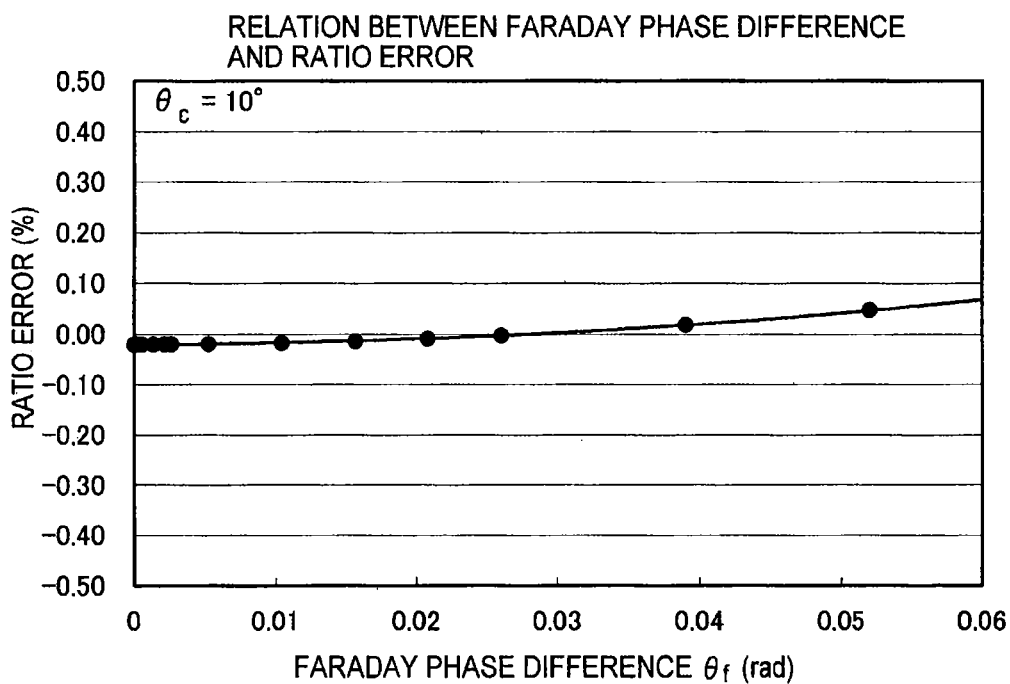
FIG. 17 is a figure showing a relation between $\theta_f$ generated by the measured current I and the ratio error according to the second embodiment of the present invention. (in case $\theta_c=10°$ and $P_{1\omega}=0$)

Next, in order to show how much precisely the approximation by the above equation 69 is carried out, the relation between $\theta_f$ and the ratio error with respect to the misalignment angle $\theta_c$ between the mutual fibers at point A in FIG. 1 is shown in FIGS. 16 and 17 by defining the ratio error by the following equation 71.

$$\text{Ratio error (\%)} = \left(\frac{\frac{1}{4}\arctan\left(\left(\sum_{n=0}^{1} a_n \cdot \eta^n\right) \cdot P_k\right)}{\theta_f}\right)\times 100 \quad (71)$$

As shown in FIGS. 16 and 17, the approximation equation shown by the equation 69 can realize a highly precise approximation, and it becomes possible to approximate the current of $\theta_f<0.06$ (rad) with an approximation accuracy less than 0.1% in the range of $\theta_c=0°$ to 10°. That is, a highly precise current measurement is realizable by compensating the output of the optical current sensor using the compensation circuit 109b according to the equation 69.

According to the second embodiment as above, the phase modulation depth is controlled so that the first-order harmonics obtained by the synchronous detection of the detected light amount with the phase modulation angular frequency by the detector 106 becomes "0". Further, the compensation is carried out to the normalized amplitude of the third-order harmonics with one of the second-, fourth- and sixth-order harmonics with a value obtained by dividing the amplitude of the second-order harmonics with the amplitude of the sixth-order harmonics. Here, even in case where any two of the even-order harmonics of the second- to sixth-order harmonics are used, the same effect is obtained. Moreover, the arctangent compensation is carried out to the above compensated current to obtain the output of the Sagnac interferometer-type fiber-optic current sensor. Accordingly, since the compensated output can be used, even if the polarization extinction ratio of the light transmitting fiber 200 to optically connect the sensor head unit 300 with the signal processing unit 100 deteriorates, it becomes possible to offer the optical current sensor in which the highly precise current measurement is achieved.

According to this embodiment, since the phase modulation depth of the phase modulator is controlled so that the amplitude of the first-order harmonics becomes "0", it becomes possible to carry out the phase modulation actually applied to the light with a constant modulation value, and even if the phase modulation efficiency of the phase modulator changes with temperature and aging, etc., the output change of the Sagnac interferometer-type fiber-optic current sensor can be suppressed.

Furthermore, since the odd-order harmonics are the values approximately proportional to the current to be measured, and the odd-order harmonics and the even-order harmonics are the values approximately proportional to the detected light amount by the detector. Accordingly, even if it is a case where the detected light amount changes with the emitted light amount of the light source and the optical transmission loss of the optical propagation path, etc., a stable output proportional to the current to be measured can be obtained by normalizing the odd-order harmonics with the even-order harmonics. Especially, since the amplitude of the first-order harmonics is controlled to become "0", the third or higher odd-order harmonics is effective in order to obtain the output proportional to the current to be measured.

Moreover, since the value of the amplitude of the third-order harmonics is large as compared with the amplitudes of other odd-harmonics, the third-order harmonics is hard to be affected by the influence of a noise. Similarly, since the value of the amplitudes of the second-, fourth- and sixth-order harmonics are also large as compared with the amplitudes of other even-order harmonics, the harmonics are also hard to be affected by the influence of the noise. Therefore, the normalization output obtained by normalizing the amplitude of the third-order harmonics using one of the amplitudes of the second-, fourth- and sixth-order harmonics shows a good linearity with the magnitude of the current to be measured even if the value of the polarization extinction ratio between the phase modulator and the quarter-wave plate changes under a condition that the polarization extinction ratio is small or constant.

In the above embodiment, although the third odd-order harmonics is used as a current corresponding output, other odd-order harmonics can be used to normalize in the same way as above. Moreover, although the second- and fourth-order harmonics are used for normalizing the third-order harmonics as the current corresponding output, and the second-, fourth- and sixth-order harmonics are used to compensate the normalized output as the even-order harmonics, other even-order harmonics can be used in the same way as the above.

3. Third Embodiment

Next, the structure of the Sagnac interferometer-type fiber-optic current sensor according to the third embodiment is explained below. In the third embodiment, since the components other than the phase modulator driving circuit 108 is the same as those of the first embodiment, the explanation about the components shall be omitted and the same marks or symbols is denoted.

The feature of the third embodiment is that $R=2\delta \sin \omega_m \alpha$ is set to be larger than 0 and smaller than 7 in the phase modulator driving circuit 108 so that $P_{1\omega}$ does not become "0" except $R=2\delta \sin \omega_m \alpha \approx 3.83$ as explained later.

Next, the control of the phase modulator by the phase modulator driving circuit 108 according to the third embodiment is explained below including the prior problems.

In the second embodiment, the phase modulator driving circuit 108 controls the phase modulator so as to be $P_{1\omega}=0$. However, when the current I to be measured is "0", that is, when $\theta_f=0$, $P_{1\omega}$ becomes "0" regardless of the magnitude of the phase modulation depth η as apparent from the equation 31. Therefore, the phase modulation η can take any values, and the control to set $P_{1\omega}=0$ may runaway. Further, if the modulation depth η becomes extremely large, the phase modulator 105 may be damaged.

The above unfavorable operation is resulted by the structure of the phase modulator 105. The phase modulator 105 is a Pockels' cell type or a cylindrical piezo-electric tube type configured by twisting an optical fiber around it. In the both elements, the phase modulation is carried out by applying a voltage to the Pockels' cell element or a cylindrical piezo-electric tube. Accordingly, the magnitude of the applied voltage is proportional to the phase modulation depth. In addition, in case of $\theta \neq 0$, the conditions to become $P_{1\omega}=0$ exist besides $R=2\delta \sin \omega_m \alpha \approx 3.83$ (refer to FIG. 3).

Therefore, in the third embodiment, the phase modulation depth η is changed in the range in which the conditions to become $P_{1\omega}=0$ are not satisfied except $R=2\delta \sin \omega_m \alpha \approx 3.83$ by the phase modulator driving circuit 108 in order to solve such problem. Practically, $R=2\delta \sin \omega_m \alpha$ is controlled to be larger than 0 and smaller than 7 in order to avoid to become $P_{1\omega}=0$ except $R=2d\delta \sin \omega_m \alpha \approx 3.83$ as shown in FIG. 3.

Here, $\omega_m \alpha$ is obtained by dividing the product of the optical light path length ($L_{opt}$) specified by the time lag of time for two circular polarized lights propagating in the Faraday element to receive the phase modulation respectively by the phase modulator and the phase modulation angular frequency ($\omega_m$) with the twice as much velocity of the light (2c) (namely, $\omega_m \alpha = \omega_m L_{opt}/2c$) according to the equation 25c. Therefore, if the phase modulation angular frequency $\omega_m$ is decided, $\omega_m \alpha$ becomes a fixed value (constant value) decided exclusively.

That is, it is possible to control $R=2\delta \sin \omega_m \alpha \approx 3.83$ by only the phase modulation depth δ. Moreover, the phase modulator driving circuit 108 controls $R=2\delta \sin \omega_m \alpha$ so as to be larger than 0 and smaller than 7. Here, R is obtained by multiply the phase modulation depth δ by a sine value of the value obtained by dividing the product of the optical light path length ($L_{opt}$) specified by the time lag of time for two circular polarized lights propagating in the Faraday element to receive the phase modulation respectively by the phase modulator 105 and the phase modulation angular frequency ($\omega_m$) with the twice as much velocity of the light (2c).

Thus, according to the third embodiment, the amplitude of the third-order harmonics is large, and the condition to control the first-order harmonics to become "0" is exclusively decided. Therefore, the control to set the first-order harmonics to "0" can be stabilized.

Moreover, the amplitude of the third-order harmonics becomes smaller under other conditions than the above in which the first-order harmonics becomes "0". Therefore, the above condition is that in which the amplitude of the third-order harmonics becomes the largest, and the condition cannot be easily affected by the influence of the noise. In addition, in case of the measured current value is "0", the first-order harmonics becomes "0". Thereby, the phase modulation depth of the phase modulator can take any values, and the control which sets the first-order harmonics to "0" may runaway, or if the phase modulation depth is very large, the phase modulator may be damaged. However, since a limitation is imposed to the phase modulation depth according to this embodiment, it also becomes possible to suppress the damage of the phase modulator.

While certain embodiments have been described, these embodiments have been presented by way of example only, and are not intended to limit the scope of the inventions. In practice, the structural elements can be modified without departing from the spirit of the invention. Various embodiments can be made by properly combining the structural elements disclosed in the embodiments. For example, some structural elements may be omitted from all the structural elements disclosed in the embodiments. Furthermore, the structural elements in different embodiments may properly be combined. The accompanying claims and their equivalents are intended to cover such forms or modifications as would fall with the scope and spirit of the invention.

What is claimed is:

1. A Sagnac interferometer fiber-optic sensor, comprising:
a synchronous detection circuit to carry out synchronous detection of a detected light signal with a phase modulation angular frequency of a phase modulator;
a signal processing circuit to calculate and output the magnitude of current to be measured using the signal detected in the synchronous detection circuit; and
a phase modulator driving circuit to control the driving of the phase modulator;
wherein the phase modulator driving circuit controls a phase modulation depth so that the amplitude of the first-order harmonics obtained by carrying out the synchronous detection of the detected light signal with the phase modulation angular frequency becomes zero;

wherein the signal processing circuit includes a normalization means to calculate a reference value by dividing the amplitude of the third-order harmonics with the amplitude of one of the second-, fourth- and sixth-order harmonics, in which the amplitude of the first-order harmonics is controlled to become zero by the phase modulator driving circuit, and the normalized reference value is outputted as an output signal proportional to the current to be measured.

2. The Sagnac interferometer fiber-optic sensor according to claim 1, wherein the signal processing circuit includes a compensation means to compensate the reference value with a ratio between any two amplitudes of the second-, fourth- and the sixth-order harmonics, and the compensated value with the compensating means is outputted as an output signal proportional to the magnitude of the current to be measured.

3. The Sagnac interferometer fiber-optic sensor according to claim 1, wherein the signal processing circuit includes an arctangent compensation means to carry out the arctangent compensation to the reference value, and the compensated value by the arctangent compensation means is outputted as an output signal proportional to the magnitude of the current to be measured.

4. The Sagnac interferometer fiber-optic sensor according to claim 2, wherein the signal processing circuit includes an arctangent compensation means to carry out the arctangent compensation to the compensated value, and the compensated value by the arctangent compensation means is outputted as an output signal proportional to the magnitude of the current to be measured.

5. The Sagnac interferometer fiber-optic sensor according to claim 1, wherein the phase modulator driving circuit controls the phase modulation depth so that the value calculated by the following equation becomes smaller than 7 and larger than zero, $$\frac{L_{opt}\omega_m\delta}{2c}$$

$L_{opt}$: Optical light path length specified by the time lag to respectively receive the phase modulation by the phase modulator
$\delta$: Phase modulation depth
$\omega$: Phase modulation angular frequency of the phase modulator
$c$: Light velocity.

6. The Sagnac interferometer fiber-optic sensor according to claim 1 comprising an optical filter optically connected with the phase modulator for converting light from a light source to a linear polarized light, wherein the optical filter includes;
a first Lyot depolarizer constituted by a first polarization maintaining fiber,
a polarizer constituted by a second polarization maintaining fiber optically connected with the phase modulator side, the phase modulator including a third polarization maintaining fiber to propagate light by defining an optic axis,
wherein a second Lyot depolarizer is constituted by the second and third polarization maintaining fibers to respectively connect between the phase modulator and the polarizer, and full length ratio of the first Lyot depolarizer and the second Lyot depolarizer is set to be 1:2n or 2n:1 using the positive integer n.

7. The Sagnac interferometer fiber-optic sensor according to claim 1, comprising:
an optical filter optically connected with the phase modulator for converting light from a light source to a linear polarized light, the optical filter includes;
a polarizer,
a first Lyot depolarizer constituted by a first polarization maintaining fiber provided on the light source side of the polarizer and to propagate the light by defining an optic axis of the polarizer,
a second polarization maintaining fiber provided on the phase modulator side of the polarizer to propagate the light by defining an optic axis of the polarizer, the phase modulator including a third polarization maintaining fiber provided on the polarizer side to propagate light by defining an optic axis, and
a second Lyot depolarizer constituted by the second and third polarization maintaining fibers,
wherein the full length ratio of the first Lyot depolarizer and the second Lyot depolarizer is set to be 1:2n or 2n:1 using the positive integer n.

8. A Sagnac interferometer fiber-optic sensor, comprising:
a synchronous detection circuit to carry out synchronous detection of a detected light signal with a phase modulation angular frequency of a phase modulator;
a signal processing circuit to calculate and output the magnitude of current to be measured using the signal detected in the synchronous detection circuit;
a phase modulator driving circuit to control the driving of the phase modulator;
wherein the phase modulator driving circuit controls a phase modulation depth so that the amplitude of the first-order harmonics obtained by carrying out the synchronous detection of the detected light signal with the phase modulation angular frequency becomes zero; and
an optical filter optically connected with the phase modulator for converting light from a light source to a linear polarized light, wherein the optical filter includes,
a first Lyot depolarizer constituted by a first polarization maintaining fiber, and
a polarizer constituted by a second polarization maintaining fiber optically connected with the phase modulator side, the phase modulator including a third polarization maintaining fiber to propagate light by defining an optic axis,
wherein a second Lyot depolarizer is constituted by the second and third polarization maintaining fibers to respectively connect between the phase modulator and the polarizer, and full length ratio of the first Lyot depolarizer and the second Lyot depolarizer is set to be 1:2n or 2n:1 using the positive integer n.

9. A Sagnac interferometer fiber-optic sensor, comprising:
a synchronous detection circuit to carry out synchronous detection of a detected light signal with a phase modulation angular frequency of a phase modulator;
a signal processing circuit to calculate and output the magnitude of current to be measured using the signal detected in the synchronous detection circuit;
a phase modulator driving circuit to control the driving of the phase modulator;
wherein the phase modulator driving circuit controls a phase modulation depth so that the amplitude of the first-order harmonics obtained by carrying out the synchronous detection of the detected light signal with the phase modulation angular frequency becomes zero; and an optical filter optically connected with the phase modulator for converting light from a light source to a linear polarized light, the optical filter including a polarizer, a first Lyot depolarizer constituted by—a first polarization maintaining fiber provided on the light source side of the polarizer and to propagate the light by defining an optic axis of the polarizer, a second polarization maintaining fiber provided on the phase modulator side of the polarizer to propagate the light by defining an optic axis of the polarizer, the phase modulator including a third polarization maintaining fiber provided on the polarizer side to propagate light by defining an optic axis, and a second Lyot depolarizer constituted by the second and third polarization maintaining fibers, wherein the full length ratio of the first Lyot depolarizer and the second Lyot depolarizer is set to be 1:2n or 2n:1 using the positive integer n.

* * * * *